(12) United States Patent
Dordi et al.

(10) Patent No.: US 8,747,960 B2
(45) Date of Patent: Jun. 10, 2014

(54) PROCESSES AND SYSTEMS FOR ENGINEERING A SILICON-TYPE SURFACE FOR SELECTIVE METAL DEPOSITION TO FORM A METAL SILICIDE

(75) Inventors: Yezdi Dordi, Palo Alto, CA (US); John Boyd, Hillsboro, OR (US); Tiruchirapalli Arunagiri, Fremont, CA (US); Johan Vertommen, Nethen (BE); Fritz C. Redeker, Fremont, CA (US); William Thie, Mountain View, CA (US); Arthur M. Howald, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 1214 days.

(21) Appl. No.: 11/513,446

(22) Filed: Aug. 30, 2006

(65) Prior Publication Data

US 2007/0292615 A1    Dec. 20, 2007

Related U.S. Application Data

(60) Provisional application No. 60/713,494, filed on Aug. 31, 2005.

(51) Int. Cl.
*C23C 14/02* (2006.01)
*H05H 1/00* (2006.01)

(52) U.S. Cl.
USPC ............................ 427/534; 427/535; 427/539

(58) Field of Classification Search
USPC ................... 427/534, 533, 535, 539; 118/707; 438/586, 682
See application file for complete search history.

(56) References Cited

U.S. PATENT DOCUMENTS

| | | | |
|---|---|---|---|
| 6,015,747 A * | 1/2000 | Lopatin et al. | 438/586 |
| 6,017,820 A * | 1/2000 | Ting et al. | 438/689 |
| 6,107,192 A * | 8/2000 | Subrahmanyan et al. | 438/637 |
| 6,239,006 B1 | 5/2001 | Shields | |
| 6,365,516 B1 | 4/2002 | Frenkel et al. | |
| 6,475,893 B2 * | 11/2002 | Giewont et al. | 438/586 |
| 6,638,855 B1 * | 10/2003 | Chang et al. | 438/637 |
| 6,843,852 B2 | 1/2005 | Dubin et al. | |
| 6,875,693 B1 | 4/2005 | May et al. | |
| 6,890,853 B2 | 5/2005 | Biberger et al. | |
| 2001/0055934 A1 | 12/2001 | Cheung | |
| 2002/0001929 A1 * | 1/2002 | Biberger et al. | 438/584 |
| 2003/0022509 A1 | 1/2003 | Rathi et al. | |
| 2003/0134047 A1 * | 7/2003 | Dubin et al. | 427/421 |
| 2005/0164497 A1 * | 7/2005 | Lopatin et al. | 438/678 |

* cited by examiner

*Primary Examiner* — Michael Wieczorek

(74) *Attorney, Agent, or Firm* — Martine Penilla Group, LLP

(57) ABSTRACT

The embodiments fill the need to enhance electro-migration performance, provide lower metal resistivity, and improve silicon-to-metal interfacial adhesion for copper interconnects by providing improved processes and systems that produce a silicon-to-metal interface. An exemplary method of preparing a substrate surface of a substrate to selectively deposit a layer of a metal on a silicon or polysilicon surface of the substrate to form a metal silicide in an integrated system is provided. The method includes removing organic contaminants from the substrate surface in the integrated system, and reducing the silicon or polysilicon surface in the integrated system after removing organic contaminants to convert silicon oxide on the silicon or polysilicon surface to silicon, wherein after reducing the silicon or polysilicon surface, the substrate is transferred and processed in controlled environment to prevent the formation of silicon oxide, the silicon or polysilicon surface is reduced to increase the selectivity of the metal on the silicon surface. The method further includes selectively depositing the layer of the metal on the silicon or polysilicon surface of substrate in the integrated system after reducing the silicon or polysilicon surface. An exemplary system to practice the exemplary method described above is also provided.

20 Claims, 29 Drawing Sheets

| | |
|---|---|
| ○ | Cu-BTA complex |
| ● | Organic Contaminant |
| △ | Barrier metal residue |
| ▲ | Metal oxide residue |

PROCESSES AND SYSTEMS FOR ENGINEERING A SILICON-TYPE SURFACE FOR SELECTIVE METAL DEPOSITION TO FORM A METAL SILICIDE

CLAIM OF PRIORITY

This application claims priority of U.S. Provisional Application Ser. No. 60/713,494, titled "High Rate Electroless Plating and Integration Flow to Form Cu Interconnects," filed on Aug. 31, 2005 which is hereby incorporated by reference.

CROSS REFERENCE TO RELATED APPLICATION

This application is related to U.S. patent application Ser. No. 11/513,634, entitled "Processes and Systems for Engineering a Copper Surface for Selective Metal Deposition," and U.S. patent application Ser. No. 11/514,038, entitled "Processes and Systems for Engineering a Barrier Surface for Selective Copper Deposition," both of which are filed on the same day as the instant application. The disclosure of these related applications is incorporated herein by reference in their entireties for all purposes.

BACKGROUND

Integrated circuits use conductive interconnects to wire together the individual devices on a semiconductor substrate, or to communicate externally to the integrated circuit. Interconnect metallization for vias and trenches may include aluminum alloys and copper. Electro-migration (EM) is a well-known reliability problem for metal interconnects, caused by electrons pushing and moving metal atoms in the direction of current flow at a rate determined by the current density. Electro-migration can eventually lead to the thinning of the metal line, which can result in higher resistivity or, worst case, a metal line breakage. Fortunately, not every interconnect metal line on an IC has current moving in the same direction all the time, as it mostly does in power supply and ground lines. However, as metal lines get narrower (International Technology Roadmap for Semiconductors (ITRS) calls for a ~0.7× reduction in the line width for every technology node), electro-migration becomes more of an issue.

In aluminum lines, EM is a bulk phenomenon and is well controlled by the addition of small amounts of a dopant, such as copper. EM in copper lines, on the other hand, is a surface phenomenon. It can occur wherever the copper is free to move, typically at an interface where there is poor adhesion between the copper and another material. In today's dual-damascene process, this happens most often on the top of the copper line where it interfaces with what is typically a SiC diffusion barrier layer, but it can also happen at the copper/barrier interface. With each migration to the next technology node, and resulting increase in current density, the problem worsens.

The solution to EM problems, as well as related stress voids, another common reliability problem, has been a story of process integration: optimized depositions (i.e. reducing thickness of barrier and seed layers), pre- and post-deposition wafer cleanings, surface treatments, etc., all aimed at providing homogeneous surfaces and good adhesion between layers to minimize metal atom migration and void propagation. In the dual-damascene process, trenches and holes (for contacts and vias) are etched in the dielectric, then lined with a barrier material, such as tantalum (Ta), tantalum nitride (TaN), or a combination of both films, followed by the deposition of a copper seed layer, copper electroplating, copper planarization using CMP and then deposition of a dielectric stack, such as SiC/low-k/SiC. Since an oxide readily forms on copper when copper is exposed to air, proper post-CMP cleaning and removal of the copper oxide before capping the copper with SiC is required to ensure good adhesion between copper and SiC. Removal of the copper oxide prior to the SiC deposition is essential to good EM performance and reducing resultant metal resistivity.

Recently, capping Copper with a cobalt-alloy capping layer, such as CoWP (cobalt tungsten phosphide), CoWB (cobalt tungsten boride), or CoWBP (cobalt tungsten borophosphide), before the SiC dielectric barrier layer, has been shown to significantly improve electro-migration, compared to SiC over copper. FIG. 1 shows that the cobalt-alloy capping layers 20, 30 are deposited over copper layers 23, 33 and under dielectric capping SiC layers 25, 35, respectively. Ta and/or TaN barrier layers are illustrated as layers 24, 34. The cobalt-alloy layers 20, 30 improve the adhesion between copper 23, 33 and SiC cap layers 25, 35. The cobalt-alloy layers 20, 30 can also exhibit certain copper diffusion barrier characteristics. The cobalt-alloy capping layers can be selectively deposited on copper by electroless deposition. However, the electroless deposition can be inhibited by thin copper oxide layer, which can be formed when copper is exposed to air. Further, contaminants on the copper and dielectric surfaces can cause pattern-dependent plating effects include pattern-dependent thickness of the Co alloy, as well as pattern-dependent copper line thickness loss in part due to etching during the 'incubation' time required to initiate the Co plating reaction. Therefore, it is important to control the processing environment to limit (or control) the growth of native copper oxide, and to remove copper oxide and organic contaminants on the copper surface and organic and metallic contaminants on the dielectric surface immediately prior to depositing the metallic capping layer, such as a cobalt-alloy. Further, to reduce pattern-dependent deposition variability, the dielectric surface must be controlled to normalize its influence across structures of different pattern densities. Engineering the metal-to-metal interface between the copper layers 23, 33, between copper and barrier layers 33 and 34, 23 and 24, and the adhesion promoting layers (or metallic capping layers), such as the cobalt-alloy layers 20, 20, is very critical in ensuring good interfacial adhesion and good EM performance. Further, as metal lines become narrower, physical vapor deposition (PVD) barrier and seed films form a larger part of the metal line, increase the effective resistivity, and hence current density. Thin and conformal barrier and seed layers can mitigate this trend, with atomic layer deposition (ALD) barriers (TaN, Ru or hybrid combinations) providing conformal step coverage and acceptable barrier properties, and electroless Cu process providing a conformal seed layer. Until now, however, there is no electroless Cu seed layer that can adhere to the ALD TaN barrier films produced.

In view of the foregoing, there is a need for systems and processes that produce a metal-to-metal interface with improved electro-migration performance, low sheet resistance, and improved interfacial adhesion for copper interconnects.

SUMMARY

Broadly speaking, the embodiments fill the need by providing improved processes and systems that produce a silicon-to-metal interface to enhance electro-migration performance, provide lower metal resistivity, and improve silicon-to-metal interfacial adhesion for copper interconnects. It should be appreciated that the present invention can be implemented in numerous ways, including as a solution, a method, a process, an apparatus, or a system. Several inventive embodiments of the present invention are described below.

In one embodiment, a method of preparing a substrate surface of a substrate to selectively deposit a layer of a metal on a silicon or polysilicon surface of the substrate to form a metal silicide in an integrated system is provided. The method includes removing organic contaminants from the substrate surface in the integrated system, and reducing the silicon or polysilicon surface in the integrated system after removing organic contaminants to convert silicon oxide on the silicon or polysilicon surface to silicon, wherein after reducing the silicon or polysilicon surface, the substrate is transferred and processed in controlled environment to prevent the formation of silicon oxide, the silicon or polysilicon surface is reduced to increase the selectivity of the metal on the silicon surface. The method further includes selectively depositing the layer of the metal on the silicon or polysilicon surface of substrate in the integrated system after reducing the silicon or polysilicon surface.

In another embodiment, an integrated system for processing a substrate in controlled environment to enable selective deposition of a layer of a metal on a silicon surface of a substrate to form a metal silicide is provided. The system includes a lab-ambient transfer chamber capable of transferring the substrate from a substrate cassette coupled to the lab-ambient transfer chamber into the integrated system, and a vacuum transfer chamber operated under vacuum at a pressure less than 1 Torr, wherein at least one vacuum process module is coupled to the vacuum transfer chamber. The system further includes a vacuum process module for removing organic contaminants from the substrate surface, wherein the vacuum process module for removing the organic contaminants is at one of the least one vacuum process module coupled to the vacuum transfer chamber, and is operated under vacuum at a pressure less than 1 Torr.

In addition, the system includes a vacuum process chamber for reducing the silicon surface, wherein the vacuum process module for reducing the silicon surface is at one of the least one vacuum process module coupled to the vacuum transfer chamber, and is operated under vacuum at a pressure less than 1 Torr, and a controlled-ambient transfer chamber filled with an inert gas selected from a group of inert gases, and at least one controlled-ambient process module coupled to the controlled-ambient transfer chamber. Additionally, the system includes an electroless metal deposition process module used to selectively deposit the thin layer of the metal on the silicon surface after the silicon surface has been reduced, the electroless metal deposition process module is one of the at least one controlled-ambient process module coupled to the controlled-ambient transfer chamber.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for improved metal integration techniques that modify metal interfaces by removing interfacial metal oxide by reduction to improve electro-migration metal resistivity and interface adhesion are provided. It should be appreciated that the present invention can be implemented in numerous ways, including a process, a method, an apparatus, or a system. Several inventive embodiments of the present invention are described below. It will be apparent to those skilled in the art that the present invention may be practiced without some or all of the specific details set forth herein.

Figure 1:
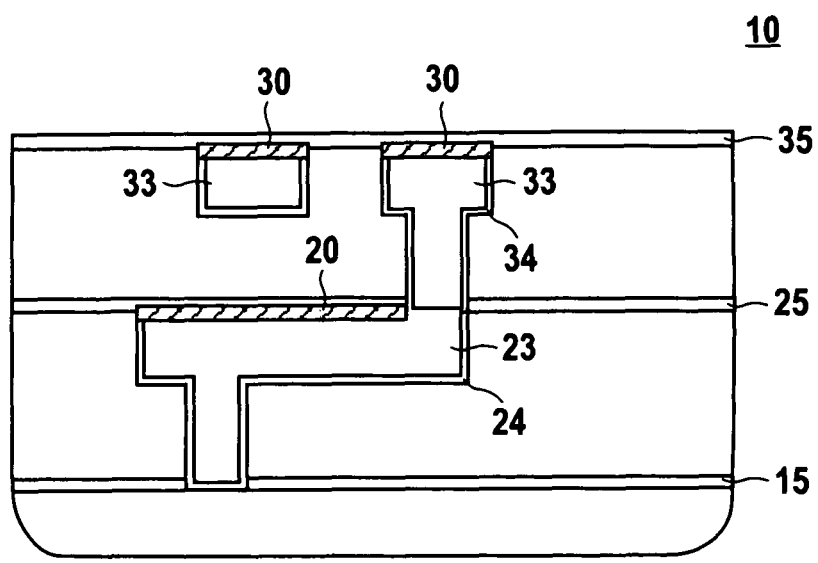
FIG. 1 shows an exemplary cross section interconnects.
Figure 2A:
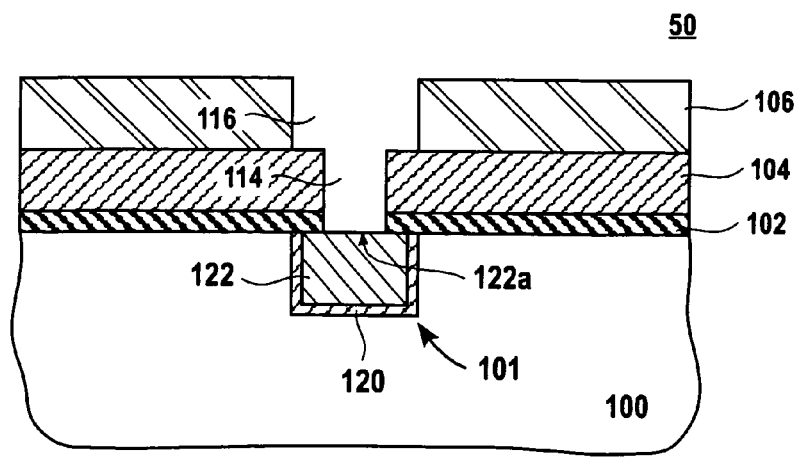
FIGS. 2A-2D show cross sections of an interconnect structure at various stages of interconnect processing.

FIG. 2A shows an exemplary cross-section of an interconnect structure(s) after being patterned by using a dual damascene process sequence. The interconnect structure(s) is on a substrate 50 and has a dielectric layer 100, which was previously fabricated to form a metallization line 101 therein. The metallization line is typically fabricated by etching a trench into the dielectric 100 and then filling the trench with a conductive material, such as copper.

In the trench, there is a barrier layer 120, used to prevent the copper material 122, from diffusing into the dielectric 100. The barrier layer 120 can be made of PVD tantalum nitride (TaN), PVD tantalum (Ta), ALD TaN, or a combination of these films. Other barrier layer materials can also be used. A barrier layer 102 is deposited over the planarized copper material 122 to protect the copper material 122 from premature oxidation when via holes 114 are etched through overlying dielectric materials 104, 106 to the barrier layer 102. The barrier layer 102 is also configured to function as a selective etch stop and a copper diffusion barrier. Exemplary barrier layer 102 materials include silicon nitride (SiN) or silicon carbide (SiC).

A via dielectric layer 104 is deposited over the barrier layer 102. The via dielectric layer 104 can be made of an organosilicate glass (OSG, carbon-doped silicon oxide) or other types of dielectric materials, preferably with low dielectric constants. Exemplary silicon dioxides can include, a PECVD un-doped TEOS silicon dioxide, a PECVD fluorinated silica glass (FSG), a HDP FSG, OSG, porous OSG, etc. and the like. Commercially available dielectric materials including Black Diamond (I) and Black Diamond (II) by Applied Materials of Santa Clara, Calif., Coral by Novellus Systems of San Jose, Aurora by ASM America Inc. of Phoenix, Ariz., can also be used. Over the via dielectric layer 104 is a trench dielectric layer 106. The trench dielectric layer 106 may be a low K dielectric material, such as a carbon-doped oxide (C-oxide). The dielectric constant of the low K dielectric material can be about 3.0 or lower. In one embodiment, both the via and trench dielectric layers are made of the same material, and deposited at the same time to form a continuous film. After the trench dielectric layer 106 is deposited, the substrate 50 that holds the structure(s) undergoes patterning and etching processes to form the vias holes 114 and trenches 116 by known art.

Figure 2B:
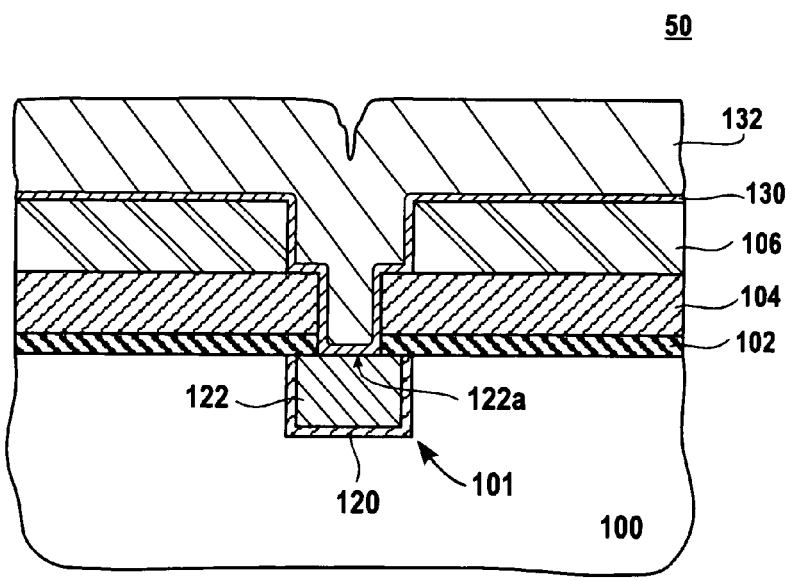

FIG. 2B shows that after the formation of vias holes 114 and trenches 116, a barrier layer 130 and a copper layer 132 are deposited to line and fill the via holes 114 and the trenches 116. The barrier layer 130 can be made of tantalum nitride (TaN), tantalum (Ta), Ruthenium (Ru), or a hybrid combination of these films. While these are the commonly considered materials, other barrier layer materials can also be used. A copper film 132 is then deposited to fill the via holes 114 and the trenches 116.

Figure 2C:
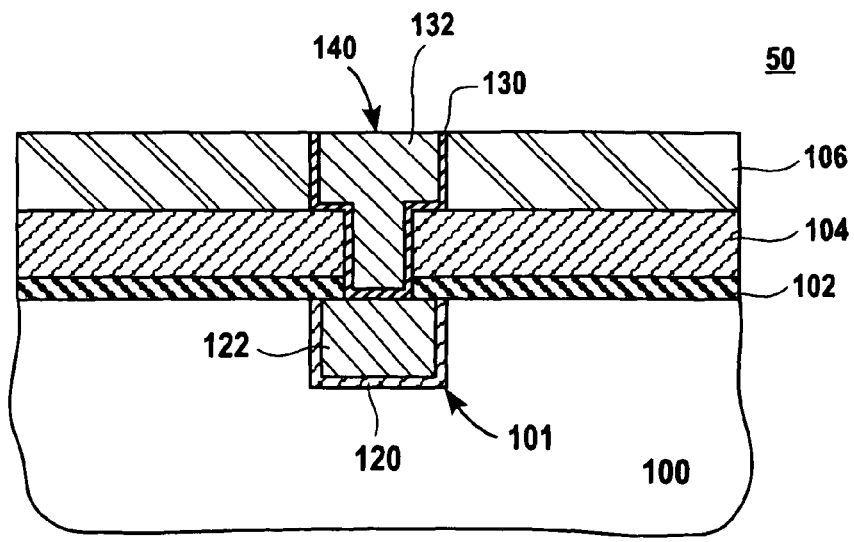
Figure 2D:
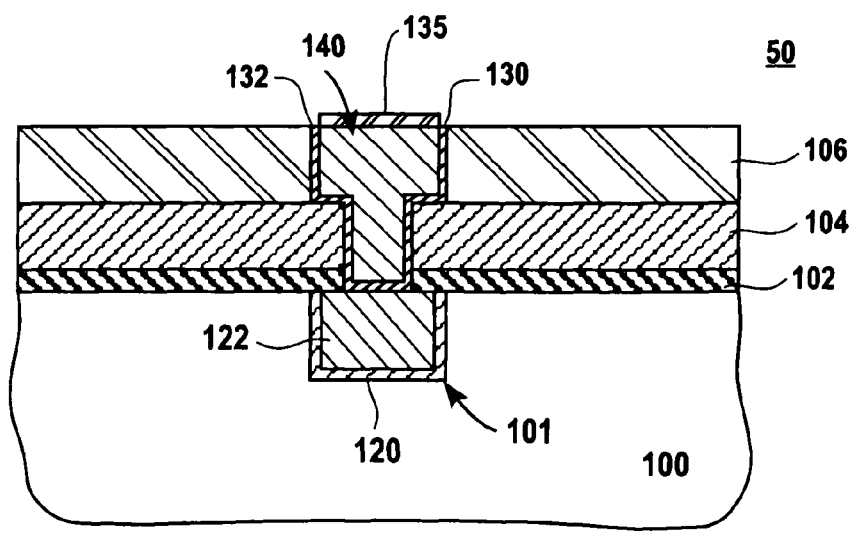

After copper film 132 fills the via holes 114 and trenches 116, substrate 50 is planarized by chemical-mechanical polishing (CMP) to remove the copper material (or copper overburden) and barrier layer (or barrier overburden) over the surface of dielectric 106, as shown in FIG. 2C. The next step is to cap the copper surface 140 with a copper/SiC interface adhesion promoter layer 135, such as a cobalt-alloy, as shown in FIG. 2D. Examples of the cobalt-alloy include: CoWP, CoWB, or CoWBP, which can be selectively deposited over copper by an electroless process. The thickness of the adhesion-promoting layer can be as thin as a monolayer, which is only a few angstroms, such as 5 angstroms, to a thicker layer, such as 200 to 300 angstroms, which could also serve as a Cu diffusion barrier, eliminating the need for a dielectric cap.

Figure 3:
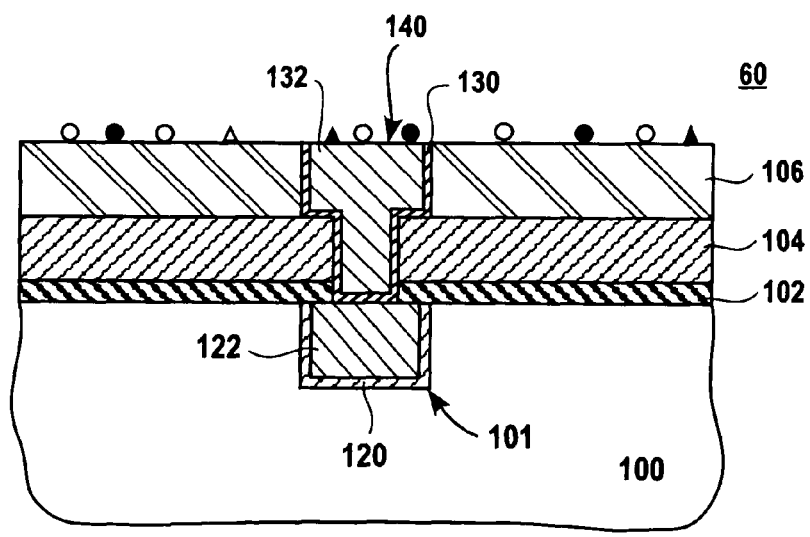
FIG. 3 shows various forms of contaminants on substrate surface after metal CMP.

Chemical-mechanical polishing (CMP) of copper often uses benzotrizole (BTA) as a copper corrosion inhibitor. Copper forms Cu-BTA complexes with BTA. A substrate that has been processed through Cu CMP and post-CMP clean can contain copper residues in the form of a Cu-BTA complex, which is illustrated as open circles in FIG. 3, on both the Cu lines and the adjacent dielectric. Cu-BTA complexes on the dielectric need to be removed to prevent increased current leakage or metal shorting. Further, residues of Ta or other barrier material, which is illustrated as open triangles in FIG. 3, may be present in small amounts, in addition to various organic contaminants, which are illustrated as filled circles in FIG. 3. In addition to these contaminants, there are various oxides of the metals present, primarily CuO and $CuO_2$, which are illustrated as filled triangles in FIG. 3. Cu-BTA complexes metal oxides, and organic contaminants are three major surface contaminants that must be removed from the substrate surface. Preparing a dielectric surface and a metal surface that are free of organics and metal-containing compound contaminants is challenging and requires multiple surface preparation steps that could include both wet and dry processes.

Following are several exemplary process flows and systems that provide surface preparation of an underlying metal to allow an over-laying metal layer to be deposited on top with good adhesion properties between the two metal layers. The metal layers deposited by the exemplary process flows and systems would exhibit improved EM performance and thus an overall lower metal resistivity.

Figure 4A:
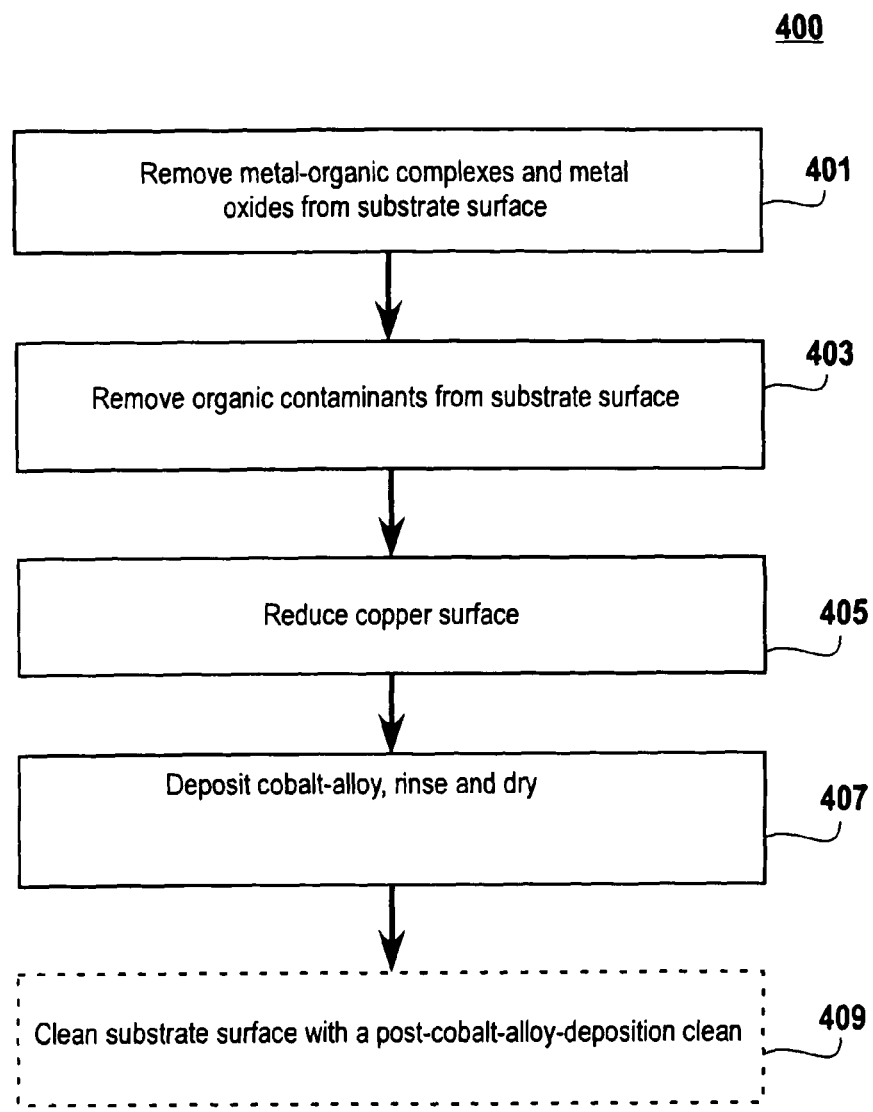
FIG. 4A shows an exemplary process flow to prepare a copper surface for electrolessly depositing a cobalt-alloy.

1. Engineering Copper Surface for Cobalt-Alloy Deposition
Case I: Metal CMP Stops on Dielectric Layer FIG. 4A shows an embodiment of a process flow of surface preparation for electrolessly depositing a cobalt-alloy over a post-CMP copper surface 140 of the dual-damascene via-trench structure shown in FIG. 2C. The substrate(s) used in the process flow 400 of FIG. 4A have just finished metal CMP processing(s) to remove copper and barrier overburden layers, such as Ta and/or TaN. As described above in the paragraph related to FIG. 3, there are various metallic and organic contaminants on the substrate surface.

The process starts at step 401 by removing metal-organic complex contaminants (or complexed metal-organic contaminants), such as Cu-BTA complex, and metal oxides from the substrate surface. Although metal contaminants will be removed from both the copper and dielectric surfaces, the purpose of this step is to enhance selectivity and improve the Co film morphology by eliminating potential sources of metal that could later serve as nucleation sites for the subsequent Co-alloy deposition. Copper-BTA complex, copper oxide ($CuO_x$) and other metal oxides, such as tantalum oxide ($TaO_y$), are removed from the substrate surface during this step. The amount of copper oxide to be removed depends on the contaminant level and depth of metal oxides on the surface. Metal complex and metal oxide can be removed by an $O_2$/Ar sputtering process, or a wet chemical removal process in an 1-step or a 2-step wet chemical process sequence. The preferred embodiment uses a wet process to remove the complexed metal and metal oxides. The wet chemical removal process can use an organic acid, such as DeerClean offered by Kanto Chemical Co., Inc. of Japan or a semi-aqueous solvent, such as ESC 5800 offered by DuPont of Wilmington, Del., an organic base such as tetramethylammonium chloride (TMAH), complexing amines such as ethylene diamine, diethylene triamine, or proprietary chemistry such as ELD clean and Cap Clean 61, provided by Enthone, Inc. of West Haven, Conn. Removing Cu-BTA from the dielectric surface ensures that copper from the Cu-BTA complex will not be oxidized to copper oxide and subsequently reduced to copper during other surface preparation steps, reducing selectivity and providing nucleation points on the dielectric surface on which to grow the Co alloy, causing shorts and increasing the leakage current. Therefore, Cu-BTA removal process can also reduce yield loss due to metal shorting or current leakage.

Cu-BTA complexes and other metal oxide contaminants are two key metal contaminants to be removed during this step, which can be done in either a controlled or uncontrolled ambient (or environment). For example, Cu-BTA can be removed by a wet clean process that involves a cleaning solution including tetramethylammonium hydroxide (TMAH), complexing amines such as ethylene diamine, diethylene triamine, or proprietary cleaning chemistries such as ELD clean and Cap Clean 61, provided by Enthone, Inc. of West Haven, Conn. Metal oxides, specifically copper oxide, can be removed using a weak organic acid such as citric acid, or other organic or inorganic acids can be used. Additionally, very dilute (i.e. <0.1%) peroxide-containing acids, such as sulfuric-peroxide mixtures, can also be used. The wet clean process can also remove other metal or metal oxide residues.

The presence of BTA on the copper lines of different pattern or feature types, such as small dense, small isolated or wide copper lines, is a result of passivation of the lines, the amount of which is related, in part, to the degree of the galvanic effect occurring on these features. This can result in the formation of pattern-dependent passivation layers. This dependence can further influence the Co-alloy deposition characteristics, resulting in pattern-dependent deposition characteristics, sometimes referred to as incubation or initiation effects. Removing BTA from the Cu lines can help eliminate this pattern-dependent deposition effect of cobalt-alloy (to be deposited at a subsequent step) and allow uniform cobalt-alloy deposition in the dense and isolated features.

The organic contaminants can be removed by an oxidizing plasma such as an oxygen-containing plasma process in step 403. The oxygen ($O_2$) plasma process is preferably conducted at a relatively low temperature of less than 120° C. High temperature $O_2$ plasma process tends to oxidize copper into a thicker layer, making it harder to reduce later. Therefore, a low temperature $O_2$ plasma process is preferred. In one embodiment, the $O_2$ plasma process can be a downstream plasma process. Alternatively, organic residues (or contaminants) can also be removed by using an $O_2$/Ar sputtering process to physically remove the organic contaminants. $O_2$ plasma process and $O_2$/Ar sputtering process are typically operated under less than 1 Torr.

Once the substrate surface is free of contaminants, such as Cu-BTA, metal oxide, and other organic contaminants, the substrate should be exposed to as little oxygen as possible to protect the copper surface from oxidation. Copper oxidation is not a self-limiting process. The amount and duration of oxygen the copper surface is exposed to should be limited (or controlled) to minimize the copper oxide formation. Although copper oxide will be reduced at a later step, thicker layers of copper oxide may not be fully reduced. Therefore, it is important to limit the exposure of copper to oxygen to only that needed to remove the organic contaminants. To achieve controlled and limited exposure to oxygen, the substrate should be transferred or processes in controlled environments, such as an environment under vacuum or an environment filled with inert gas(es).

To ensure that the copper surface is free of copper oxide, the substrate surface is reconditioned in a reducing environment to convert any residual copper oxide into copper at step 405. The previous pre-clean steps will have removed any metals from the dielectric layer, and thus metal reduction is performed only on the copper lines. The copper surface reduction can be achieved by a hydrogen-containing plasma process to convert copper oxide to copper (or substantially copper). Exemplary reactive gases that can be used to generate the hydrogen-containing plasma include hydrogen ($H_2$), ammonia ($NH_3$), and carbon monoxide (CO). For example, the substrate surface is reduced by a hydrogen-containing plasma, which is generated by hydrogen ($H_2$) gas, ammonia ($NH_3$) gas, or a combination of both gases, and the substrate is at an elevated temperature of between 20° C. and 300° C. In one embodiment, the hydrogen plasma process is a downstream plasma process. Once the substrate goes through a hydrogen reduction process, the substrate is ready for the cobalt-alloy deposition. The copper surface needs to be carefully protected to ensure no copper oxide formation. As described above, electroless deposition of cobalt-alloy can be inhibited by the presence of copper oxide. Therefore, it is important to control the processing and transport environments to minimize the exposure of the copper surface to oxygen.

At next process step 407, the cobalt-alloy, such as CoWP, CoWB or CoWBP, is electrolessly deposited on top of the copper surface. The electroless deposition of the cobalt-alloy is a wet process, and deposits on catalytic surfaces, such as copper surface, only. The cobalt-alloy only deposits selectively on the copper surface.

After the electroless deposition of the cobalt-alloy, the process flow can enter an optional process step 409 of a post-deposition clean. Post-deposition clean can be accomplished by using a brush scrub clean with a chemical solution, such as a solution containing CP72B supplied by Air Products and Chemical, Inc. of Allentown, Pa. Other substrate surface cleaning processes can also be used, such as Lam's C3™ or P3™ cleaning technology. Other post clean chemicals can include a hydroxylamine-based chemistry to remove any metal-based contaminants that might remain on the dielectric surface after electroless plating.

Figure 4B:
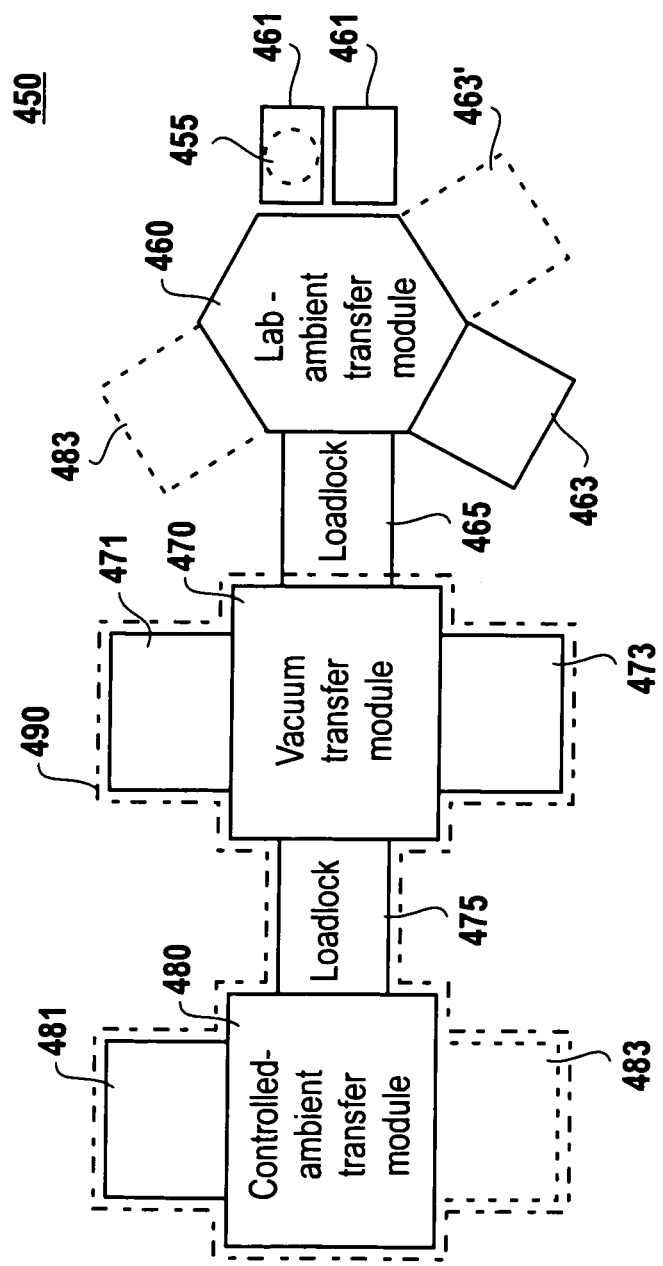
FIG. 4B shows an exemplary system used to process a substrate through a process flow of FIG. 4A.

As described above, the process and wafer transfer environment control is very important for preparing the copper surface for cobalt-alloy deposition, especially after the hydrogen plasma reduction of the copper surface. FIG. 4B shows a schematic diagram of an exemplary integrated system 450 that allows minimal exposure of substrate surface to oxygen at critical steps after surface treatment. In addition, since it is an integrated system, the substrate is transferred from one process station immediately to the next process station, which limits the duration that the prepared copper surface is exposed to oxygen. The integrated system 450 can be used to process substrate(s) through the entire process sequence of flow 400 of FIG. 4A.

As described above, the surface treatments, electroless deposition of cobalt-alloy and the optional post-cobalt-alloy deposition process involve a mixture of dry and wet processes. The wet processes are typically operated near atmosphere, while the dry $O_2$ plasma, hydrogen plasma, and $O_2$/Ar sputtering are all operated at less than 1 Torr. Therefore, the integrated system needs to be able to handle a mixture of dry and wet processes. The integrated system 450 has 3 substrate transfer modules (or chambers) 460, 470, and 480. Transfer chambers 460, 470 and 480 are equipped with robots to move substrate 455 from one process area to another process area. The process area could be a substrate cassette, a reactor, or a loadlock. Substrate transfer module 460 is operated under lab ambient, which refers to the laboratory (or factory) environment that is under room temperature, atmospheric pressure and exposed to air, usually HEPA- or ULPA-filtered to control particle defects. Module 460 interfaces with substrate loaders (or substrate cassettes) 461 to bring the substrate 455 into the integrated system or to return the substrate to the cassette(s) 461 to continue processing outside the system 450.

As described above in process flow 400, the substrate 455 is brought to the integrated system 450 to be deposited with a cobalt-alloy, such as CoWB, CoWP, or CoWBP, after the substrate has been planarized by metal CMP to remove excess metal from the substrate surface and leaves the metal only in the metal trenches, as shown in FIG. 2C. As described in step 401 of process flow 400, the substrate, surface needs to be removed of surface contaminants such as Cu-BTA complex and other metal oxide residues. Cu-BTA and metal oxides can be removed by a wet clean process involving clean solution, such as a solution containing TMAH or complexing amines such as, but not limited to, ethylene diamine or diethylamine triamine. Following BTA-metal complex removal, metal oxides remaining on the copper and dielectric surfaces can be removed using a wet clean process involving a clean solution such as a solution containing citric acid, or other organic acid that can remove copper oxide more or less selectively to copper. Metal oxides, specifically copper oxide, can be removed using a weak organic acid such as citric acid, or other organic or inorganic acids can be used. Additionally, very dilute (i.e. <0.1%) peroxide-containing acids, such as sulfuric-peroxide mixtures, can also be used. The wet clean process can also remove other metal or metal oxide residues.

A wet clean reactor 463 can be integrated with the lab-ambient transfer module 460, which is operated at lab ambient condition. The wet clean reactor 463 can be used to perform the 1-step or 2-step clean described above at step 401 of FIG. 4A. Alternatively, an additional wet clean reactor 463' can be integrated with the lab-ambient transfer module 460 to allow the first step of the 2-step cleaning process to be performed in reactor 463 and the second step be performed in reactor 463'. For example, a cleaning solution containing chemical such as TMAH for cleaning Cu-BTA is in reactor 463 and a cleaning solution containing a weak organic acid such as citric acid for cleaning metal oxide is in reactor 463'.

A lab ambient condition is under atmosphere and open to air. Although the wet clean reactor 463 can be integrated with the lab-ambient transfer module 460 in the process flow 400, this process step can also be performed right after metal CMP and before the substrate is brought to the integrated system for cobalt-alloy deposition. Alternatively, the wet cleaning process can be performed in a controlled ambient process environment, where the controlled ambient is maintained during and after the wet cleaning step.

Organic residues (or contaminants) not removed by the previous wet cleans can be removed by a dry oxidizing plasma process, such as oxygen-containing plasma, $O_2$/Ar sputter, or Ar sputter following the removal of Cu-BTA and metal oxides. As described above, most plasma or sputtering processes are operated below 1 Torr; therefore, it is desirable to couple such systems (or apparatus, or chambers, or modules) to a transfer module that is operated under vacuum at pressure, such as under 1 Torr. If the transfer module integrated with the plasma process is under vacuum, substrate transfer is more time efficient and the process module is maintained under vacuum, since it does not require extended time to pump down the transfer module. In addition, since the transfer module is under vacuum, the substrate after cleaning by the plasma process is exposed to only very low levels of oxygen. Assuming the $O_2$ plasma process is selected to clean the organic residues, the $O_2$ plasma process reactor 471 is coupled to a vacuum transfer module 470.

Since lab-ambient transfer module 460 is operated at atmosphere and vacuum transfer module 470 is operated under vacuum (<1 Torr), a loadlock 465 is placed between these two transfer modules to allow substrate 455 to be transferred between the two modules, 460 and 470, operated under different pressures. Loadlock 465 is configured to be operated under vacuum at pressure less than 1 Torr, or at lab ambient, or to be filled with an inert gas selected form a group of inert gases.

After substrate 455 finishes the oxidizing plasma processing using $O_2$, for example, substrate 455 is moved into the hydrogen-containing reducing plasma reduction chamber (or module) 473. Hydrogen-containing plasma reduction is typically processed at a low pressure, which is less than 1 Torr; therefore, it is coupled to the vacuum transfer module 470. Once the substrate 455 is reduced with hydrogen-containing plasma, the copper surface is clean and free of copper oxide. In a preferred embodiment, after substrate 455 finishes the $O_2$ plasma processing, a $H_2$ or $H_2$/$NH_3$ plasma reduction step can be performed in-situ, without removing the wafer from the chamber. In either case, the substrate is ready for cobalt-alloy deposition after completion of the reduction process.

As described above, it is important to control the processing and transport environments to minimize the exposure of the copper surface to oxygen after the substrate is reconditioned by the hydrogen-containing reducing plasma. The substrate 455 should be process under a controlled environment, where the environment is either under vacuum or filled with one or more inert gas to limit the exposure of substrate 455 to oxygen. Dotted line 490 outlines the boundary of a part of the integrated system 450 of FIG. 4B that show the processing systems and transfer modules whose environment is controlled. Transferring and processing under controlled environment 490 limits the exposure of the substrate to oxygen.

Cobalt-alloy electroless deposition is a wet process that involves cobalt species in a solution that is reduced by a reducing agent, which can be phosphorous-based (e.g. hypophosphite), boron-based (e.g. dimethylamine borane), or a combination of both phosphorous-based and boron-based. The solution that uses phosphorous-based reducing agent deposits CoWP. The solution that uses boron-based reducing agent deposit CoWB. The solution that uses both phosphorous-based and boron-based reducing agents deposits CoWBP. In one embodiment, the cobalt-alloy electroless deposition solution is alkaline-based. Alternatively, cobalt-alloy electroless deposition solution can also be acidic. Since wet process is typically conducted under atmospheric pressure, the transfer module 480 that is coupled to the electroless deposition reactor should be operated near atmospheric pressure. To ensure the environment is controlled to be free of oxygen, inert gas(es) can be used to fill the controlled-ambient transfer module 480. Additionally, all fluids used in the process are de-gassed, i.e. dissolved oxygen is removed by commercially available degassing systems. Exemplary inert gas includes nitrogen ($N_2$), helium (He), neon (Ne), argon (Ar), krypton (Kr), and xenon (Xe).

In one embodiment, the wet cobalt-alloy electroless deposition reactor (or apparatus, or system, or module) is coupled with a rinse and dry system (or apparatus, or module) to allow the substrate to be transferred into the electroless deposition system 481 under dry condition and to come out of the system 481 in dry condition (dry-in/dry-out). The dry-in/dry-out requirement allows the electroless deposition system 481 to be integrated with the controlled-ambient transfer module 480, and avoids the need of a wet robotic transfer step to a separate rinse-dry module. The environment of the electroless deposition system 481 also needs to be controlled to provide low (or limited) levels of oxygen and moisture (water vapor). Inert gas can also be used to fill the system to ensure low levels of oxygen are in the processing environment.

Alternatively, cobalt-alloy electroless deposition can also be conducted in a dry-in/dry-out manner similar to electroless copper disclosed recently. A dry-in/dry-out electroless copper process has been developed for copper electroless deposition. The process uses a proximity process head to limit the electroless process liquid in contacting with the substrate surface on a limited region. The substrate surface not under the proximity process head is dry. Details of such process and system can be found in U.S. application Ser. No. 10/607,611, titled "Apparatus And Method For Depositing And Planarizing Thin Films On Semiconductor Wafers," filed on Jun. 27, 2003, and U.S. application Ser. No. 10/879,263, titled "Method and Apparatus For Plating Semiconductor Wafers," filed on Jun. 28, 2004, both of which are incorporated herein in their entireties. The electroless plating of cobalt-alloy can use similar proximity processing head to enable a dry-in/dry-out process.

After cobalt-alloy deposition in system 481, the substrate 455 can be sent through an optional post-deposition cleaning reactor. This can be performed using mechanical assists, such as a brush scrub using chemistry such as CP72B or hydroxylamine-based cleaning chemistries or by using other methods, such as immersion cleaning, spin-rinse cleaning, or C3™ proximity technology. A rinse and dry system must also be integrated with the brush scrub system to allow substrate 455 to be dry-in/dry-out of the wet cleaning system 483. Inert gas(es) is used to fill system 483 to ensure limited (or low) oxygen is present in the system. The system 483 is dotted to illustrate that this system is optional, since the post-deposition cleaning is optional, as described above in FIG. 4A. Since the post-deposition clean step is the last process that is to be operated by the integrated system 450, the substrate 455 needs to be brought back into cassette 461 after processing. Therefore, the cleaning system 483 can alternatively be coupled to the lab-ambient transfer module 460, as shown in FIG. 4B. If the cleaning system 483 is coupled to the lab-ambient transfer module 460, the cleaning system 483 is not operated under controlled environment and inert gas(es) does not need to fill the system.

As described above, the Cu-BTA and metal oxide removal process step(s) can also be performed right after metal CMP and before the substrate is brought to the integrated system for cobalt-alloy deposition.

Case II: Metal CMP Stops on Barrier Layer

Figure 5A:
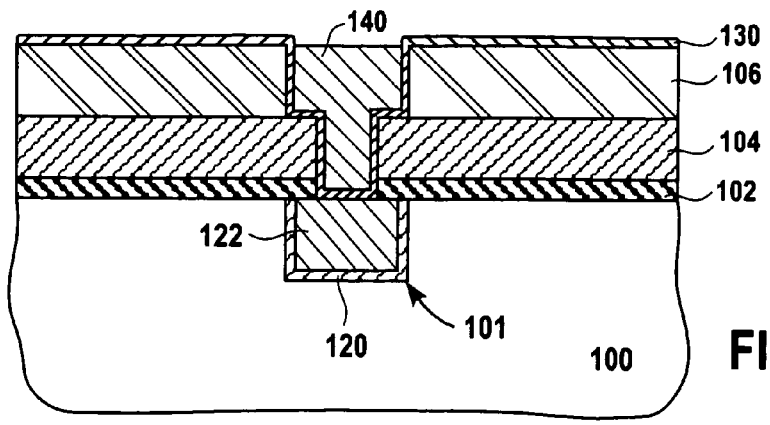
FIGS. 5A-5C show cross sections of an interconnect structure at various stages of interconnect processing.
Figure 5B:
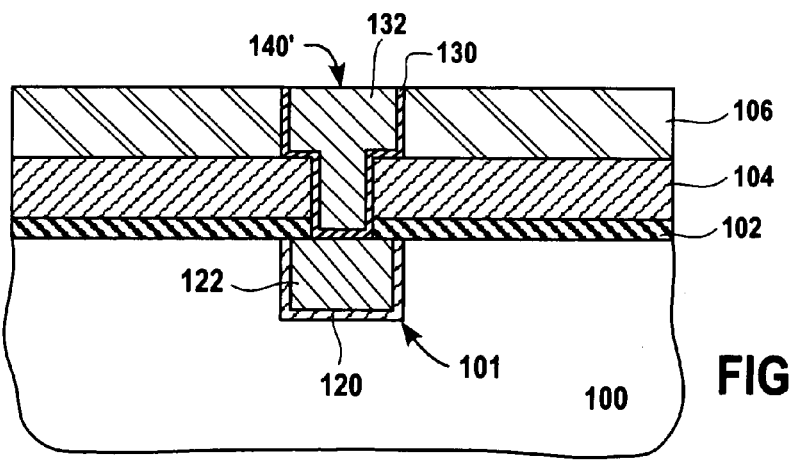
Figure 5C:
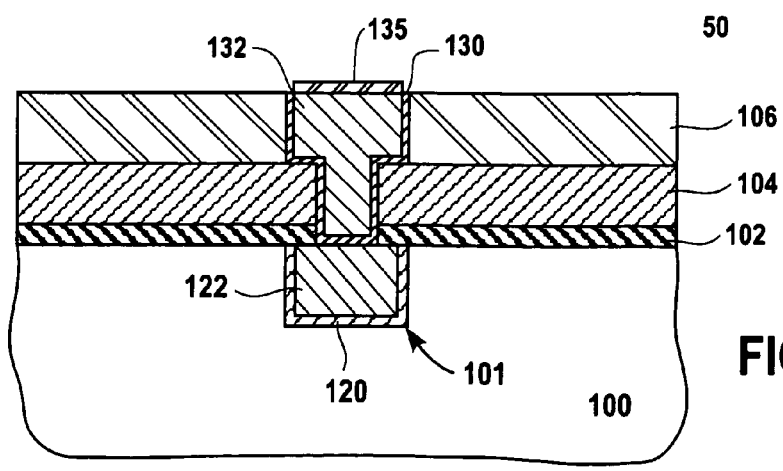
Figure 6A:
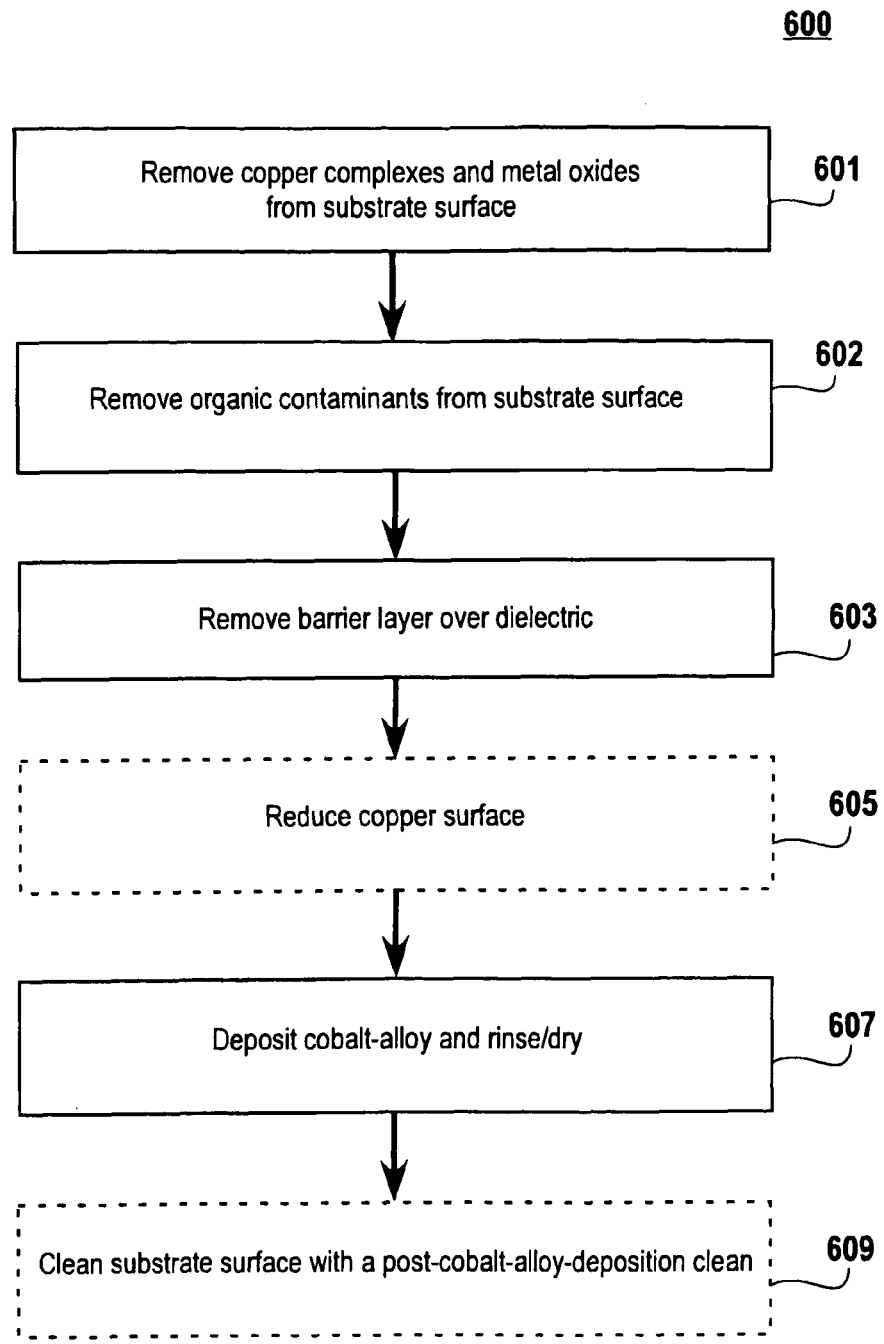
FIG. 6A shows an exemplary process flow to prepare a copper surface for electrolessly depositing a cobalt-alloy.

FIGS. 5A-5C show the cross sections of an interconnect structure at various stages of processing. The copper layer on the substrate of FIG. 5A has been planarized by CMP. The barrier layer 130 has not been removed, and remains on the substrate surface. FIG. 6A shows an embodiment of a process flow of surface preparation for electrolessly depositing a cobalt-alloy over copper in the dual-damascene metal trench. The substrate(s) used in the process flow 600 of FIG. 6A have just finished copper CMP processing(s) to remove copper. Barrier layer still remains on the substrate surface, as shown in FIG. 5A. The difference between Case II and Case I is that in Case II the surface of dielectric 106 is not exposed to Cu-BTA complex or other copper compound residues. The dielectric surface has higher quality (or less metal contaminants) in Case II than in Case I. Therefore, process step(s) aiming at removing copper oxide on the dielectric layer, which is formed after $O_2$ plasma used to remove organic contaminants, can be eliminated.

The process starts at step 601 of removing metallic contaminants, such as Cu-BTA or metal oxides, from the substrate surface. As described above, Cu-BTA complexes and metallic oxides are two key surface metallic contaminants to be removed. The processes used to remove metallic contaminants, such as Cu-BTA and metal oxides, from the substrate surface have been described above. For example, Cu-BTA and metal oxides, including copper oxides, can be removed by a wet clean process that involves a cleaning solution that includes, for example, tetramethylammonium hydroxide (TMAH) or complexing amines such as ethylenediamine or diethylenetriamine. Removing Cu-BTA eliminates pattern-dependent deposition effect of cobalt-alloy (to be deposited at a later step) and hence allows uniform cobalt-alloy deposition in the dense and isolated features.

Metal oxides, specifically copper oxide, can be removed using a weak organic acid such as citric acid, or other organic or inorganic acids can be used. Additionally, very dilute (i.e. <0.1%) peroxide-containing acids, such as sulfuric-peroxide mixtures, can also be used. The wet clean process can also remove other metal or metal oxide residues.

The organic contaminants, including remaining BTA on the Cu and barrier surfaces, are removed at step 602. Organic contaminants can be removed by a process such as a dry oxygen ($O_2$) plasma process or other oxidizing plasma processes, such as plasma process with $H_2O$, ozone, or hydrogen peroxide vapor. As described above, the oxygen-containing plasma process is preferably conducted at a relatively low temperature, below 50° C. and preferably below 120° C. The oxygen-containing plasma process can be a downstream plasma process. Alternatively, organic residues (or contaminants) can also be removed by using an $O_2$/Ar sputtering process to physically remove the organic contaminants. As described above, $O_2$ plasma process and $O_2$/Ar sputtering process are typically operated under less than 1 Torr.

Once the substrate surface is free of contaminants, such as Cu-BTA, metal oxides and organic contaminants, the substrate should be exposed to as little oxygen as possible to protect the copper surface from further oxidation. After surface contaminants are removed, at step 603, barrier layer, such as Ta, TaN, Ru, or a combination of the materials, is removed from substrate surface, as shown in FIG. 5B. Barrier layer can be removed by processes, such as $CF_4$ plasma, $O_2$/Ar sputtering, CMP, or by a wet chemical etch. Both $CF_4$ plasma etch and $O_2$/Ar sputtering processes are operated at less than 1 Torr.

Copper oxide existing at the copper surface 140 of FIG. 5A and produced during the plasma oxidation step might be completely removed during the barrier metal removal step 603. Therefore, the process of using H-containing plasma to reduce copper surface becomes optional. However, to ensure that the copper surface is free of copper oxide, the substrate surface can (optionally) be reduced to convert any residual copper oxide into copper at step 605. The copper surface reduction can be achieved by a hydrogen-containing plasma process to convert copper oxide to copper. Process gas(es) and process condition used by the hydrogen-containing plasma process have been described above in Case I. Once the substrate went through a hydrogen reduction process, the substrate is ready for the cobalt-alloy deposition. The copper surface needs to be carefully protected from oxygen to ensure no copper oxide formation. As described above, electroless deposition of cobalt-alloy can be inhibited by the presence of copper oxide. Therefore, it's important to control the processing and transport environments to minimize or to eliminate the exposure of the copper surface to oxygen.

At next process step 607, the cobalt-alloy, such as CoWP, CoWB or CoWBP, is electrolessly deposited on the top of the copper surface. Cobalt-alloy is shown as layer 135 in FIG. 5C.

The electroless deposition of the cobalt-alloy is a selective deposition and is a wet process. The cobalt-alloy only deposits on the copper surface.

As described above for Case I, after the electroless deposition of the cobalt-alloy, the process flow can enter an optional process step 609 of a post-deposition clean. Post-deposition clean can be performed by using a brush scrub clean with a chemical solution, such as a solution containing CP72B supplied by Air Products and Chemical, Inc. of Allentown, Pa., or by hydroxylamine-base chemicals, in order to removal any metal contaminants on the dielectric surface introduced by the electroless deposition process. Other substrate surface cleaning processes can also be used.

Figure 6B:
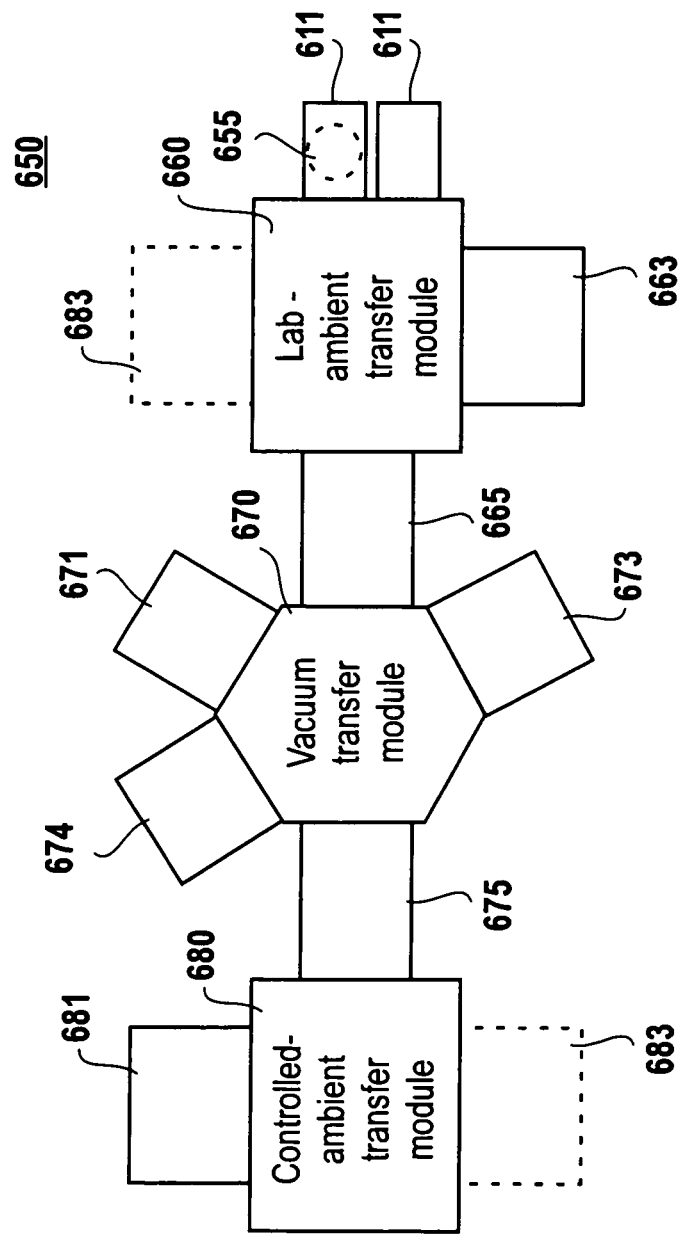
FIG. 6B shows an exemplary system used to process a substrate through a process flow of FIG. 6A.

As described above, the environment control is very important for preparing the copper surface for cobalt-alloy deposition, especially after the H-containing plasma reduction of the copper surface. FIG. 6B shows a schematic diagram of an exemplary integrated system 650 that allows minimal exposure of substrate surface to oxygen at critical steps after surface treatment. The integrated system 650 can be used to process substrate(s) through the entire process sequence of flow 600 of FIG. 6A.

Similar to the integrated system 450, the integrated system 650 has 3 substrate transfer modules 660, 670, and 680. Transfer modules 660, 670 and 680 are equipped with robots to move substrate 655 from one process area to another process area. Substrate transfer module 660 is operated under lab ambient. Module 660 interfaces with substrate loaders (or substrate cassettes) 661 to bring the substrate 655 into the integrated system or to return the substrate to the cassette(s) 661 to continue processing outside the system 650.

As described above in process flow 600, the substrate 655 is brought to the integrated system 650 to be deposited with a cobalt-alloy, such as CoWB, CoWP, or CoWBP, after the substrate has been planarized by copper CMP to remove excess copper from the substrate surface and leaves barrier layer on the dielectric surface and copper in the metal trenches, as shown in FIG. 5A. As described in step 601 of process flow 600, the substrate surface needs to be removed of surface contaminants such as Cu-BTA, metal oxides and organic residues. Cu-BTA and metal oxides can be removed by a wet clean process involving clean solution, such as a solution containing TMAH. A wet clean reactor 663 can be integrated with the lab-ambient transfer module 660. Although the wet clean reactor 663 can be integrated with the lab-ambient transfer module 660 in the process flow 600, this process step can also be performed right after metal CMP and before the substrate is brought to the integrated system for cobalt-alloy deposition. Alternatively, the wet cleaning process can be performed in a controlled ambient process environment, where the controlled ambient is maintained during and after the wet cleaning step.

Organic residues (or contaminants) not removed by the wet clean process 601 performed in reactor 683 can be removed by a dry plasma process, such as $O_2$ plasma or $O_2$/Ar sputter, at step 602. As described above, most plasma or sputtering processes are operated below 1 Torr; therefore, it's desirable to couple such systems to a transfer module that is operated under vacuum at pressure, such as under 1 Torr. Assuming $O_2$ plasma process is selected to clean the organic residue, the $O_2$ plasma process reactor 671 is coupled to a vacuum transfer module 670.

The $O_2$ plasma process can be a downstream plasma process. Although the O2 plasma reactor 671 can be integrated with the vacuum transfer module 670 in the process flow 600, this process step can also be performed right after metal CMP and before the substrate is brought to the integrated system for cobalt-alloy deposition.

Since lab-ambient transfer module 660 is operated under atmosphere and vacuum transfer module 670 is operated under vacuum (<1 Torr), a loadlock 665 is placed between these two transfer modules to allow substrate 655 to be transferred between the two modules, 660 and 670.

After substrate 655 finishes the $O_2$ plasma processing, substrate 655 is moved into a processing system for barrier layer etch, as shown in step 603. The barrier layer etch chamber (or module) 673, if a dry barrier plasma etch process is selected, can be coupled to the vacuum transfer module 670. The dry barrier plasma process can be a $CF_4$ plasma process or an $O_2$/Ar sputtering process.

The process following barrier layer etch is an optional H-containing plasma reduction to ensure no copper oxide remains on the copper surface. The $H_2$ plasma reduction can be performed in a plasma chamber (or module) 674, which is coupled to the vacuum transfer module 670. Alternatively, hydrogen plasma reduction can also be performed sequentially in the $O_2$ plasma reactor 671 used to remove organic residues after purging the chamber of residual oxygen species.

As described above, cobalt-alloy electroless deposition is a wet chemical process. Since a wet process is typically conducted at atmospheric pressure, the transfer module 680 that is coupled to the electroless deposition reactor should be operated near atmospheric pressure. To ensure the environment is controlled to be free of oxygen, inert gas(es) can be used to fill the controlled-ambient transfer module 680. Additionally, all fluids used in the process are de-gassed, i.e. dissolved oxygen is removed by commercially available degassing systems.

The wet cobalt-alloy electroless deposition reactor needs to be coupled with a rinse and dry system to allow the substrate to be transferred to the electroless deposition system 681 under dry conditions and to come out of the system 681 in dry condition (dry-in/dry-out). As described above, the dry-in/dry-out requirement allows the electroless deposition system 681 to be integrated with the controlled-ambient transfer module 680. Inert gas(es) is used to fill system 681 to ensure low (or limited, or controlled) oxygen levels are maintained in the system.

After cobalt-alloy deposition in system 681, the substrate 655 can be sent through a post-deposition cleaning reactor 683. A rinse and dry system also needs to be integrated with the brush scrub system to allow substrate 655 to be dry-in/dry-out of the wet cleaning system 683. Inert gas(es) is used to fill system 683 to ensure no oxygen is present. The system 683 is dotted to illustrate that this system is optional, since the post-deposition cleaning is optional, as described above in FIG. 6A. Since the post-deposition clean step is the last process that is to be operated by the integrated system 650, the substrate 655 needs to be brought back into cassette 661 after processing. The cleaning system 683 can alternatively be coupled to the lab-ambient transfer module 660.

Case III: Metal CMP Stops on a Thin Copper Layer

Figure 7A:
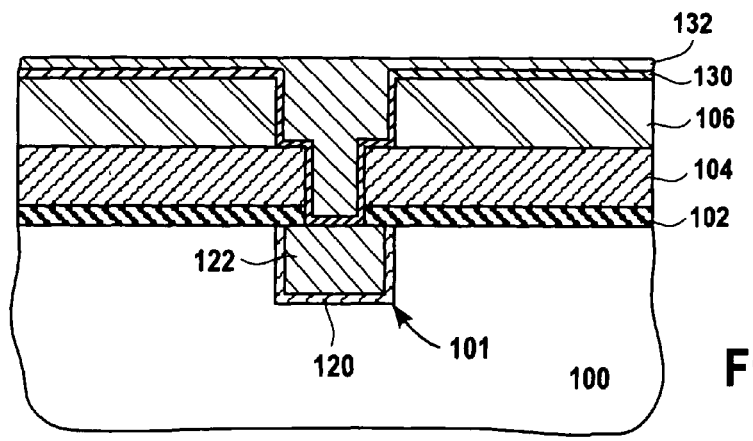
FIGS. 7A-7C show cross sections of an interconnect structure at various stages of interconnect processing.
Figure 7B:
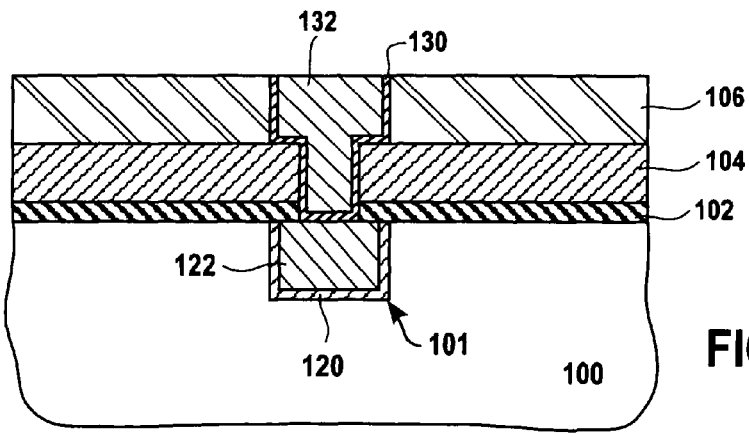
Figure 7C:
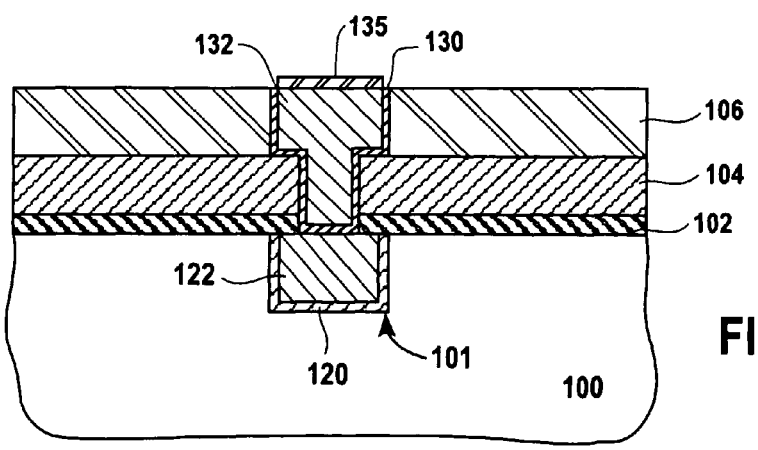
Figure 8A:
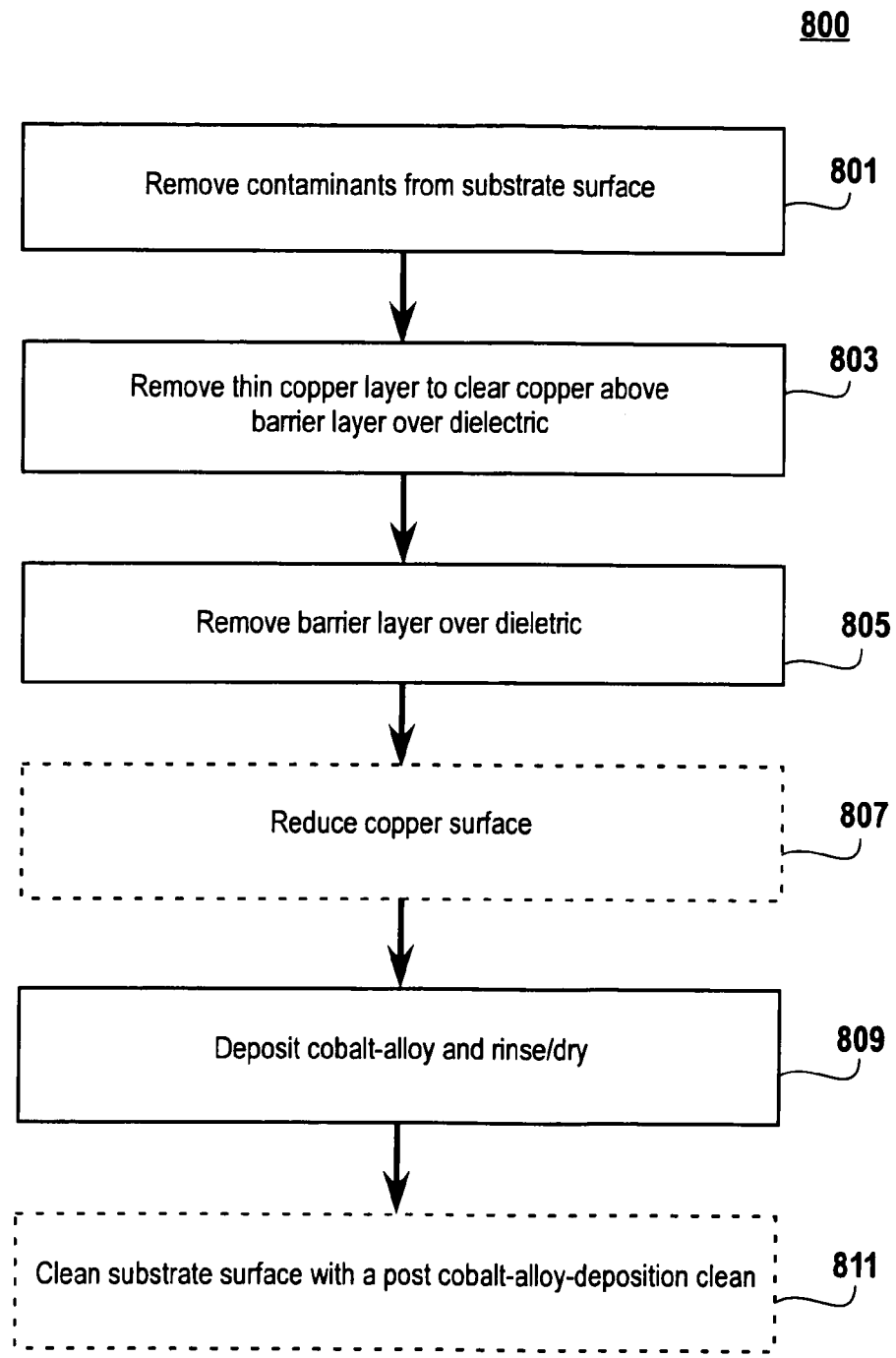
FIG. 8A shows an exemplary process flow to prepare a copper surface for electrolessly depositing a cobalt-alloy.

FIGS. 7A-7C show cross sections of an interconnect structure at various stages of interconnect processing. The substrate in FIG. 7A has just finished copper planarization, but has not fully cleared the copper from the substrate. A thin copper layer 132 remains on the substrate surface. FIG. 8A shows an embodiment of a process flow of surface preparation for electrolessly depositing a cobalt-alloy over copper in the dual-damascene metal trench. The substrate(s) used in the process flow 800 of FIG. 8A have just finished copper CMP processing(s) to remove most of the copper above the barrier layer over dielectric layer. A thin layer of copper in the range between about 100 angstrom to about 1000 angstrom is left on the barrier surface, as shown in FIG. 7A. The difference between Case III and both Case I and Case II is that in Case III a thin layer of copper cover the entire substrate surface; therefore there is no concern of galvanic corrosion of copper due to exposed dissimilar materials in the copper CMP solution. Since the thin copper layer and other surface contaminants present will be removed in an oxygen-free environment, there is no concern of copper oxidation. Therefore, no $H_2$ plasma reduction is needed. Both Case II and Case III do not have barrier CMP; therefore, metal CMP processing cost is reduced. The copper surface prepared by this process allows excellent selectivity of cobalt-alloy on the copper versus on dielectric layer.

The process starts at step 801 of removing contaminants, including organic residues and inorganic metal oxides, from the substrate surface. The organic contaminants can be removed by an oxidizing plasma such as a dry oxygen ($O_2$) plasma process, $H_2O$ plasma process, $H_2O_2$ plasma process, or a plasma with ozone vapor. As described above, the $O_2$ plasma process is preferably conducted at a relatively low temperature less than 120° C. The $O_2$ plasma process can be a downstream plasma process. Alternatively, organic residues (or contaminants) can also be removed by using an $O_2$/Ar sputtering process to physically remove the organic contaminants. As described above, $O_2$ plasma process and $O_2$/Ar sputtering process are typically operated under less than 1 Torr.

Once the substrate surface is free of contaminants, the substrate should be exposed to as little oxygen as possible to protect the copper surface from oxidation. After surface contaminants are removed, at step 803, the thin copper layer over the barrier layer and dielectric layer is removed. The thin copper layer can be removed by $O_2$/Ar sputtering, by $O_2$/hexafluoroacetylacetone (HFAC) plasma etch, by a wet chemical etch using chemicals, such as sulfuric acid and hydrogen peroxide, or by using complexing chemistries. Both $O_2$/Ar sputtering and $O_2$/HFAC plasma processes are operated under low pressure, such as below 1 Torr.

Afterwards, the barrier layer, such as Ta, TaN, or a combination of both films, is removed from substrate surface at step 805. The cross-section of the interconnect structure after the removal of the thin copper and barrier is shown in FIG. 7B. Barrier layer can be removed by $CF_4$ plasma, $O_2$/Ar sputtering, CMP, or by a wet chemical etch. Both $CF_4$ plasma etch and $O_2$/Ar sputtering processes are operated at below 1 Torr.

Since the copper surface to selectively deposit the cobalt-alloy is created by etching the thin copper layer and the barrier layer above dielectric in controlled-ambient environments, the step of using H-containing plasma to reduce the copper surface is mostly not needed. However, to ensure that the copper surface is free of copper oxide, the substrate surface can optionally be reduced to convert any residual copper oxide into copper at step 807. The copper surface reduction process has been described above. Once the substrate went through a hydrogen-containing reduction process, the substrate is ready for the cobalt-alloy deposition. The copper surface needs to be carefully protected to prevent copper oxide formation. At next process step 809, the cobalt-alloy, such as CoWP, CoWB or CoWBP, is electrolessly deposited on the top of the copper surface. Cobalt-alloy is shown as layer 135 in FIG. 7C. The electroless deposition of the cobalt-alloy is a selective deposition and is a wet process. The cobalt-alloy only deposits on the copper surface.

As described above for Case I and Case II, after the electroless deposition of the cobalt-alloy, the process flow can enter an optional process step 811 of a post-deposition clean. Post-deposition clean has been described above in Case I and Case II.

Figure 8B:
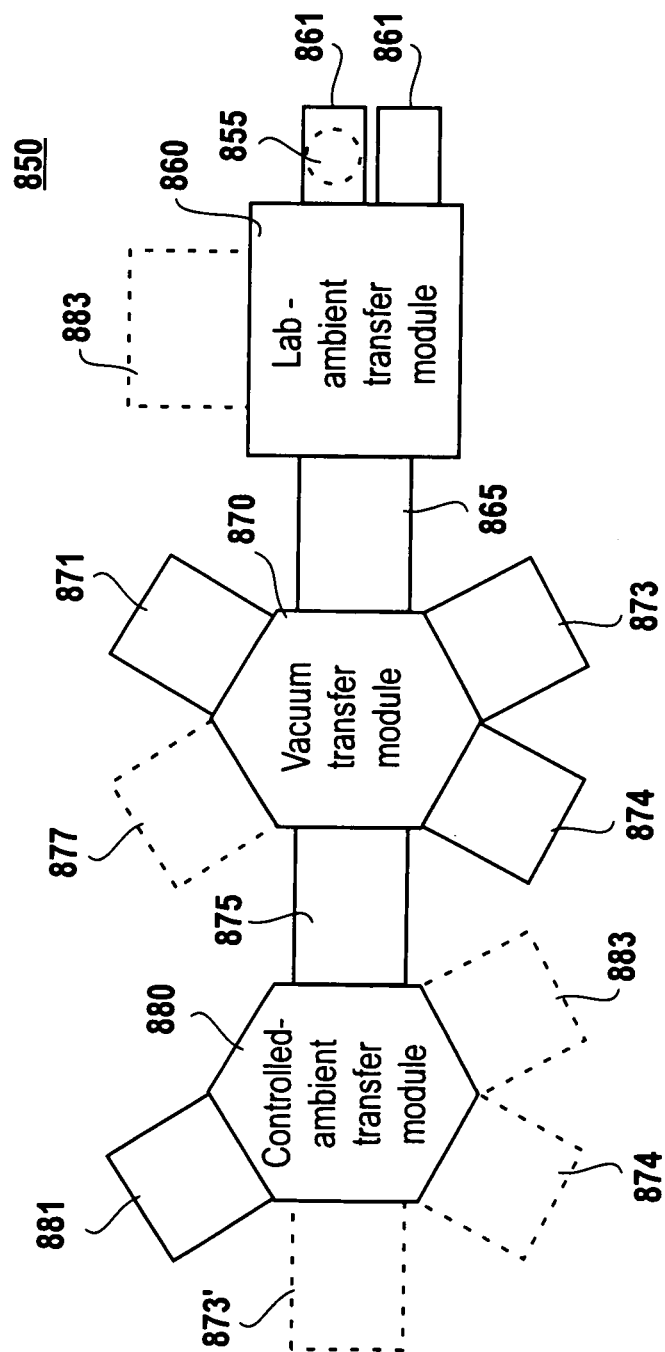
FIG. 8B shows an exemplary system used to process a substrate through a process flow of FIG. 8A.

As described above, the environment control is very important for preparing the copper surface for cobalt-alloy deposition, especially after the H-containing plasma reduction of the copper surface. FIG. 8B shows a schematic diagram of an exemplary integrated system 850 that allows minimal exposure of substrate surface to oxygen at critical steps after surface treatment. The integrated system 850 can be used to process substrate(s) through the entire process sequence of flow 800 of FIG. 8A.

The integrated system 850 has 3 substrate transfer modules 860, 870, and 880. Transfer modules 860, 870 and 880 are equipped with robots to move substrate 855 from one process area to another process area. Substrate transfer module 860 is operated under lab ambient. Module 860 interfaces with substrate loaders (or substrate cassettes) 861 to bring the substrate 855 into the integrated system or to return the substrate to the cassette(s) 861 to continue processing outside the system 850.

As described above in process flow 800, the substrate 855 is brought to the integrated system 850 to be deposited with a cobalt-alloy, such as CoWB, CoWP, or CoWBP, after the substrate has been planarized by copper CMP to remove excess copper from the substrate surface and leaves a thin copper layer on the barrier layer that is over the dielectric surface, as shown in FIG. 7A. As described in step 801 of process flow 800, the substrate surface needs to be removed of surface contaminants such organic residues and non-copper metal oxides. Due to the elimination of the need to perform a wet Cu-BTA clean, in contrast to Case I and Case II, the lab-ambient transfer module 860 can possibly be eliminated to allow cassette holders 861 to be directly coupled to loadlock 865.

Surface contaminants including organic residues and metal oxides can be removed by an oxidizing plasma process such as $O_2$ plasma or $O_2$/Ar sputter. As described above, most plasma or sputtering processes are operated below 1 Torr; therefore, it's desirable to couple such systems to a transfer module that is operated under vacuum at pressure, such as under 1 Torr. Assuming $O_2$ plasma process is selected to clean the organic residue, the $O_2$ plasma process reactor 871 is coupled to a vacuum transfer module 870.

The $O_2$ plasma process can be a downstream plasma process. Although the O2 plasma reactor 871 can be integrated with the vacuum transfer module 870 in the process flow 800, this process step can also be performed right after metal CMP and before the substrate is brought to the integrated system for cobalt-alloy deposition.

Since lab-ambient transfer module 860 is operated under atmosphere and vacuum transfer module 870 is operated under vacuum (<1 Torr), a loadlock 865 is placed between these two transfer modules to allow substrate 855 to be transferred between the two modules, 860 and 870.

After substrate 855 finishes the $O_2$ plasma processing, substrate 855 is moved into a processing system for copper etch, as shown in step 803. The copper etch chamber (or module) 873, if a dry copper plasma etch process is selected, is coupled to the vacuum transfer module 870. If a wet process is selected, the wet copper etch reactor can be integrated with a rinse/dry system to become a wet copper etch system 873' that can be coupled to the controlled-ambient transfer module 880. To enable the wet copper etch system 873' to be integrated with the controlled-ambient transfer module 880, dry-in and dry-out of substrate to the system 873' are required. In one embodiment, a rinse and dry system can be integrated in the wet copper etch system 873' to meet the dry-in/dry-out requirement. The environment of system 873' also needs to be controlled to be free of oxygen. Inert gas can also be used to fill the system to ensure no oxygen is in the processing environment.

Barrier layer etch follows copper etch, as shown in step 805. The barrier layer etch chamber 874, if a dry barrier plasma etch process is selected, can be coupled to the vacuum transfer module 870. If a wet barrier etch process is selected, the wet barrier etch reactor can be integrated with a rinse/dry system to become a wet barrier etch system 874' that can be coupled to the controlled-ambient transfer module 880. To enable the wet barrier etch system 874' to be integrated with the controlled-ambient transfer module 880, dry-in and dry-out of substrate to the system 874' are required. The environment of system 874' also needs to be controlled to provide low (or limited, or controlled) levels of oxygen. Inert gas can also be used to fill the system to ensure low oxygen levels are achieved in the processing environment.

The process following barrier layer etch is an optional H-containing plasma reduction as discussed above. The $H_2$ plasma reduction can be performed in a plasma chamber 877, which is coupled to the vacuum transfer module 870.

As described above, cobalt-alloy electroless deposition is a wet process. Since wet process is typically conducted under atmospheric pressure, the transfer module 880 that is coupled to the electroless deposition reactor should be operated near atmospheric pressure. To ensure the environment is controlled to provide low levels of oxygen, inert gas(es) can be used to fill the controlled-ambient transfer module 880. Additionally, all fluids used in the process are de-gassed, i.e. dissolved oxygen is removed by commercially available degassing systems. Exemplary inert gas includes nitrogen ($N_2$), helium (He), neon (Ne), argon (Ar), krypton (Kr), and xenon (Xe).

The wet cobalt-alloy electroless deposition reactor needs to be coupled with a rinse and dry system to allow the substrate to go into the electroless deposition system 881 under dry condition and to come out of the system 881 in dry condition (dry-in/dry-out). The dry-in/dry-out requirement allows the electroless deposition system 881 to be integrated with the controlled-ambient transfer module 880. Inert gas (es) is used to fill system 881 to ensure a low oxygen level is present in the system.

After cobalt-alloy deposition in system 881, the substrate 855 can be sent through a post-deposition cleaning reactor. A rinse and dry system also need to be integrated with the brush scrub system to allow substrate 855 to be dry-in/dry-out of the wet cleaning system 883. Inert gas(es) is used to fill system 883 to ensure no oxygen is present. The system 883 is dotted to illustrate that this system is optional, since the post-deposition cleaning is optional, as described above in FIG. 8A. Since the post-deposition clean step is the last process that is to be operated by the integrated system 850, the substrate 855 needs to be brought back into cassette 861 after processing. The cleaning system 883 can alternatively be coupled to the lab-ambient transfer module 860.

2. Engineering Barrier Surface for Electroless Copper Deposition

The system concept describe above can be used to prepare barrier surface for copper plating. Barrier layer, such as Ta, TaN or Ru, if exposed to air for extended period of time, can form $Ta_xO_y$ (Tantalum oxide), $TaO_xN_y$ (Tantalum oxynitride), or $RuO_2$ (Ruthenium oxide). Electroless deposition of a metal layer on a substrate is highly dependent upon the surface characteristics and composition of the substrate. Electroless plating of copper on a Ta, TaN, or Ru surface is of interest for both seed layer formation prior to electroplating, and selective deposition of Cu lines within lithographically defined pattern(s). One concern is the inhibition of the electroless deposition process by atomically thin native metal oxide layer formed in the presence of oxygen ($O_2$).

In addition, copper film does not adhere to the barrier oxide layer, such as tantalum oxide, tantalum oxynitride, or ruthenium oxide, as well as it adheres to the pure barrier metal or barrier-layer-rich film, such as Ta, Ru, or Ta-rich TaN film. Ta and/or TaN barrier layers are only used as examples. The description and concept apply to other types of barrier metals, such as Ta or TaN capped with a thin layer of Ru. As described above, poor adhesion can negatively affect the EM performance. In addition, the formation tantalum oxide or tantalum oxynitride on the barrier layer surface can increase the resistivity of the barrier layer. Due to these issues, it is desirable to use the integrated system to prepare the barrier/copper interface to ensure good adhesion between the barrier layer and copper and to ensure low resistivity of the barrier layer.

Case I: Metal Line Formation

Figure 9A:
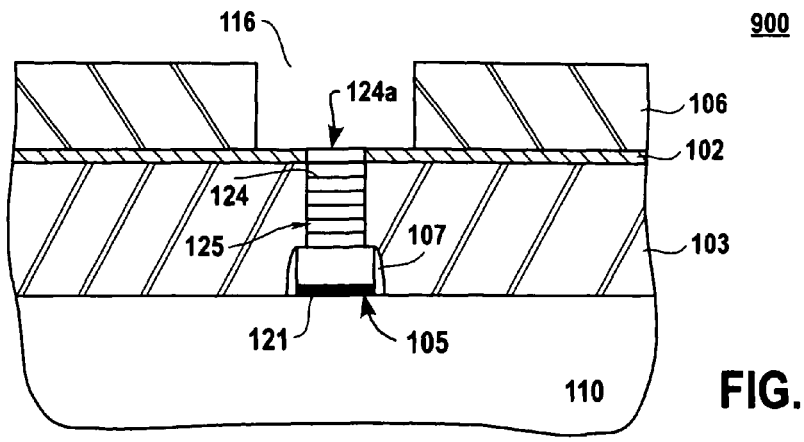
FIGS. 9A-9E show cross sections of a metal line structure at various stages of processing.

FIG. 9A shows an exemplary cross-section of a metal line structure after being patterned by a dielectric etch and being removed of photoresist. The metal line structure(s) is on a substrate 900 and has a silicon layer 110, which was previously fabricated to form a gate structure 105 with a gate oxide 121, spacers 107 and a contact 125 therein. The contact 125 is typically fabricated by etching a contact hole into the oxide 103 and then filling the contact hole with a conductive material, such as tungsten. Alternative materials may include copper, aluminum or other conductive materials. The barrier layer 102 is also configured to function as a selective trench etch stop. The barrier layer 102 can be made of materials such as silicon nitride (SiN) or silicon carbide (SiC).

Figure 9B:
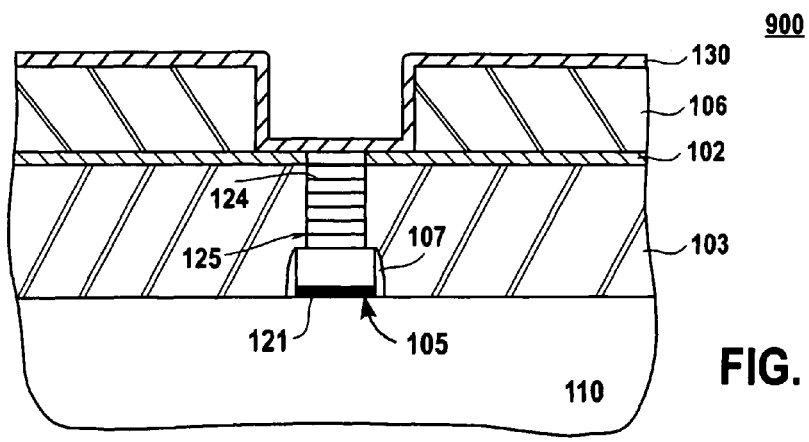
Figure 9C:
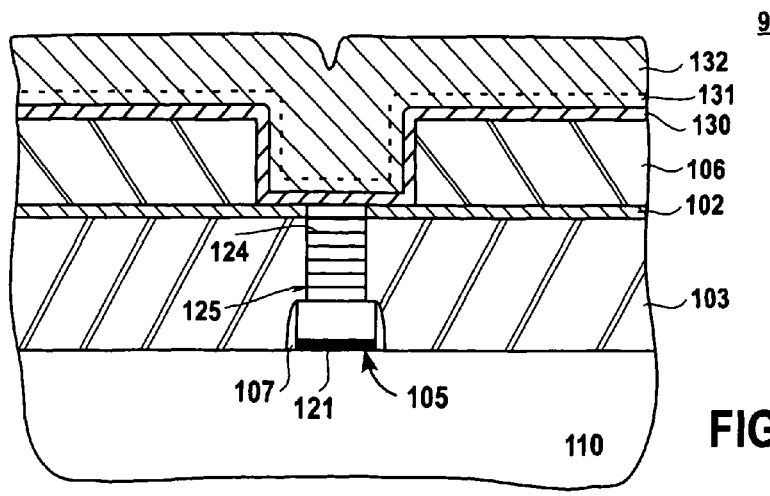

A metal line dielectric layer 106 is deposited over the barrier layer 102. The dielectric materials that can be used to deposit 106 have been described above. After the deposition of dielectric layer 106, the substrate is patterned and etched to create metal trenches 106. FIG. 9B shows that after the formation of metal trenches 116, a metallic barrier layer 130 is deposited to line metal trench 116. FIG. 9C shows that after the barrier layer 130 is deposited, a copper layer 132 is deposited over the barrier layer 130. The barrier layer 130 can be made of tantalum nitride (TaN), tantalum (Ta), Ru, or a combination of these films. A copper film 132 is then deposited to fill the metal trench 116. In one embodiment, the copper film 132 includes a thin copper seed layer 131 underneath.

Figure 9D:
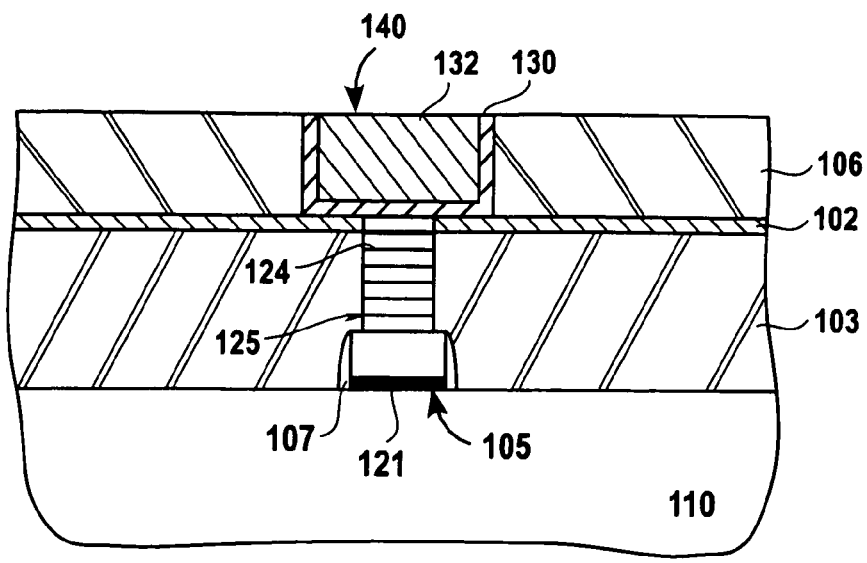
Figure 9E:
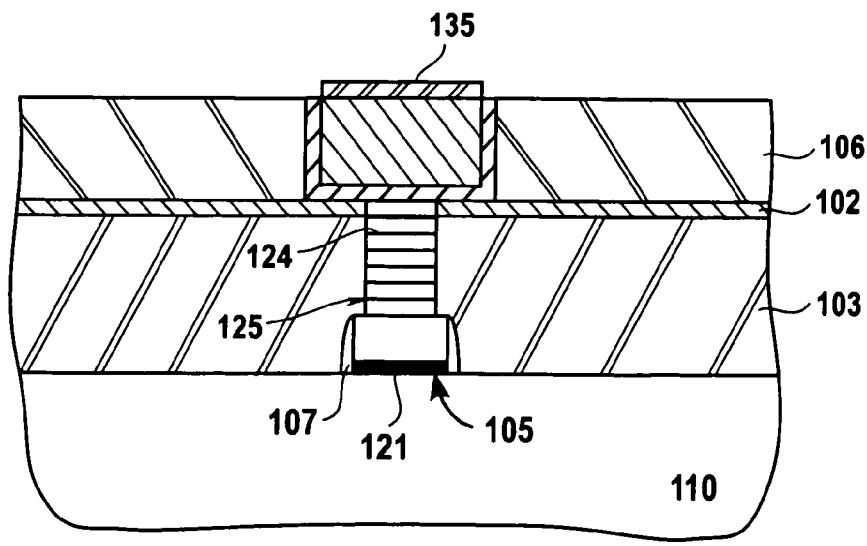

After using plasma surface pre-treatments to prepare a catalytic surface for the deposition of a conformal and thin electroless Cu seed layer 131, and copper film 132 filling trenches 116, substrate 900 is chemically and mechanically polished (CMP) or wet etched to remove the copper material (or copper overburden) and barrier layer (or barrier overburden) over the surface of dielectric 106, as shown in FIG. 9D. In one embodiment, the thickness of the thin copper seed layer is between about 5 angstroms to about 300 angstroms. The next step is to cap the copper surface 140 with a copper/SiC interface adhesion promoter layer 135, such as a cobalt-alloy, as shown in FIG. 9E. Examples of the cobalt-alloy include: CoWP, CoWB, or CoWBP, which can be selectively deposited over copper by an electroless process. The thickness of the adhesion promoter layer can be as thin as a monolayer, which is only a few angstroms, such as 5 angstroms, to a thicker layer, such as 200 angstroms.

Figure 10A:
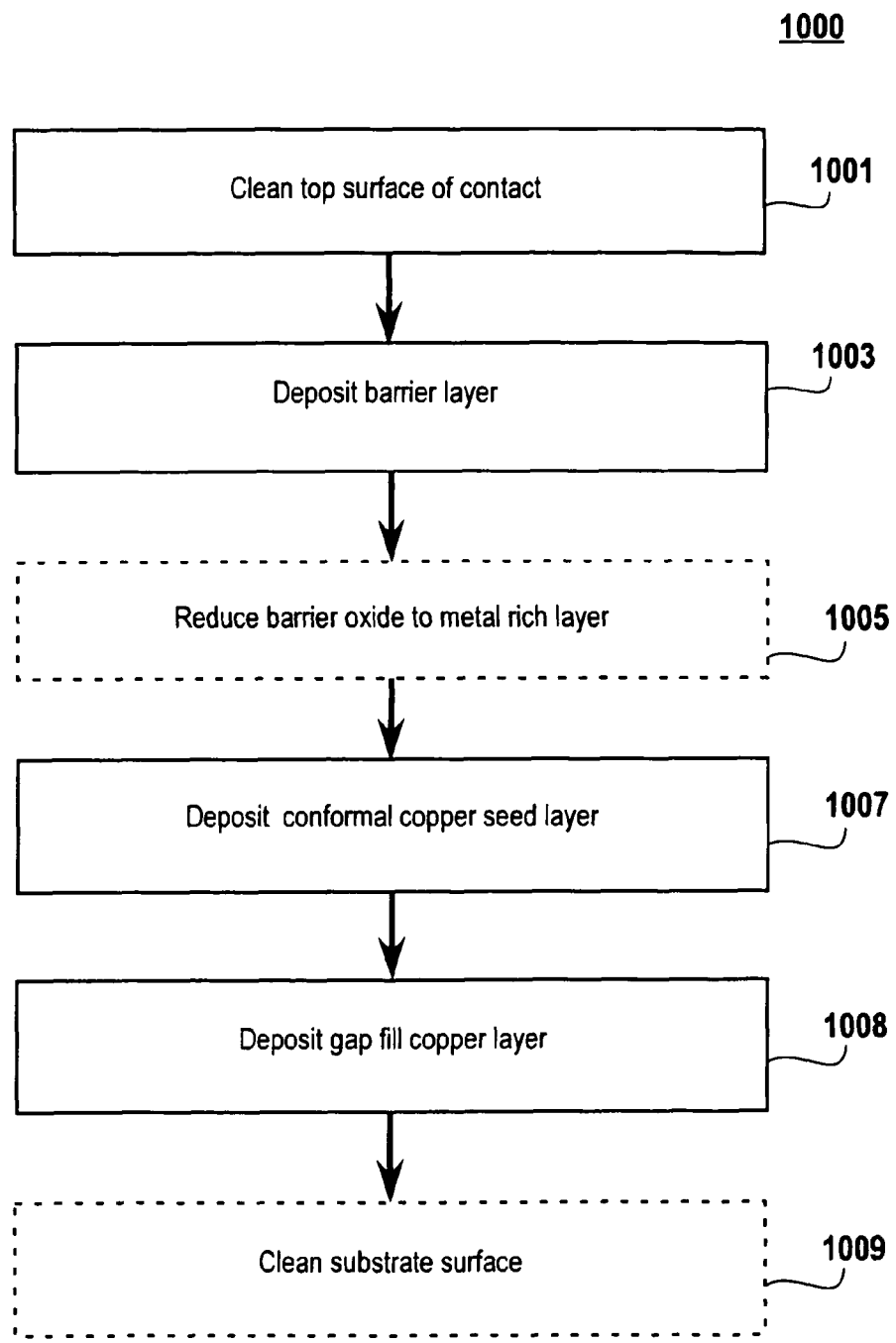
FIG. 10A shows an exemplary process flow to prepare a barrier layer surface for electrolessly depositing a copper layer.

FIG. 10A shows an embodiment of a process flow 1000 of preparing the barrier (or liner) layer surface for electroless copper deposition after the trenches have been formed. It should be noted, however, that the barrier (or liner) layer may be prepared separately in a non-integrated deposition system, such as an ALD or PVD deposition reactor. In this case, the surface preparation for depositing a thin copper seed layer would not include the metal plug preclean and barrier deposition process steps. At step 1001, the top surface 124a of the contact plug is cleaned to remove native metal oxide. Metal oxide can be removed by an Ar sputtering process, a plasma process using a fluorine-containing gas, such as $NF_3$, $CF_4$, or a combination of both, a wet chemical etch process, or a reduction process, for example using a hydrogen-containing plasma. At step 1003, a barrier layer is deposited. Due to the shrinking metal line and via critical dimension, the barrier layer may be deposited by atomic layer deposition (ALD), depending on the technology node. The thickness of the barrier layer 130 is between about 20 angstroms to about 200 angstroms. As described above, preventing the barrier layer from exposure to oxygen is critical in ensuring that electroless copper is being deposited on the barrier layer with good adhesion between copper and the barrier layer. Once the barrier layer is deposited, the substrate should be transferred or processed in a controlled-ambient environment to limit exposure to oxygen. The barrier layer is hydrogen-plasma treated to produce a metal-rich surface on the Ta, TaN, or Ru layer at optional step 1005 to provide a catalytic surface for the subsequent copper seed deposition step. Whether this step is needed or not depends on how metal-rich the surface is.

Afterwards, conformal copper seed is deposited on the barrier surface at step 1007, followed by a thick copper gap fill (or bulk fill) process, 1008. In one embodiment, the conformal copper seed layer can be deposited by an electroless process. The thick copper bulk fill process can be an electroless deposition (ELD) process or an electrochemical plating (ECP) process. Electroless copper deposition and ECP are well-known wet process. For a wet process to be integrated in a system with controlled processing and transporting environment, which has been described above, the reactor needs to be integrated with a rinse/dryer to enable dry-in/dry-out process capability. In addition, the system needs to be filled with inert gas to ensure minimal exposure of the substrate to oxygen. Recently, a dry-in/dry-out electroless copper process has been developed. Further, all fluids used in the process are de-gassed, i.e. dissolved oxygen is removed by commercially available degassing systems.

The electroless deposition process can be carried out in a number of ways, such as puddle-plating, where fluid is dispensed onto a substrate and allowed to react in a static mode, after which the reactants are removed and discarded, or reclaimed. In another embodiment, the process uses a proximity process head to limit the electroless process liquid is only in contact with the substrate surface on a limited region. The substrate surface not under the proximity process head is dry. Details of such process and system can be found in U.S. application Ser. No. 10/607,611, titled "Apparatus And Method For Depositing And Planarizing Thin Films Of Semiconductor Wafers," filed on Jun. 27, 2003, and U.S. application Ser. No. 10/879,263, titled "Method and Apparatus For Plating Semiconductor Wafers," filed on Jun. 28, 2004, both of which are incorporated herein in their entireties. The electroless plating of cobalt-alloy described earlier can also use similar proximity processing head to enable a dry-in/dry-out process.

After copper deposition at steps 1007 and 1008, the substrate can undergo an optional substrate cleaning at step 1009. Post-copper-deposition clean can be accomplished by using a brush scrub clean with a chemical solution, such as a solution containing CP72B supplied by Air Products and Chemical, Inc. of Allentown, Pa. Other substrate surface cleaning processes can also be used, such as Lam's C3™ or P3™ cleaning technology.

Figure 10B:
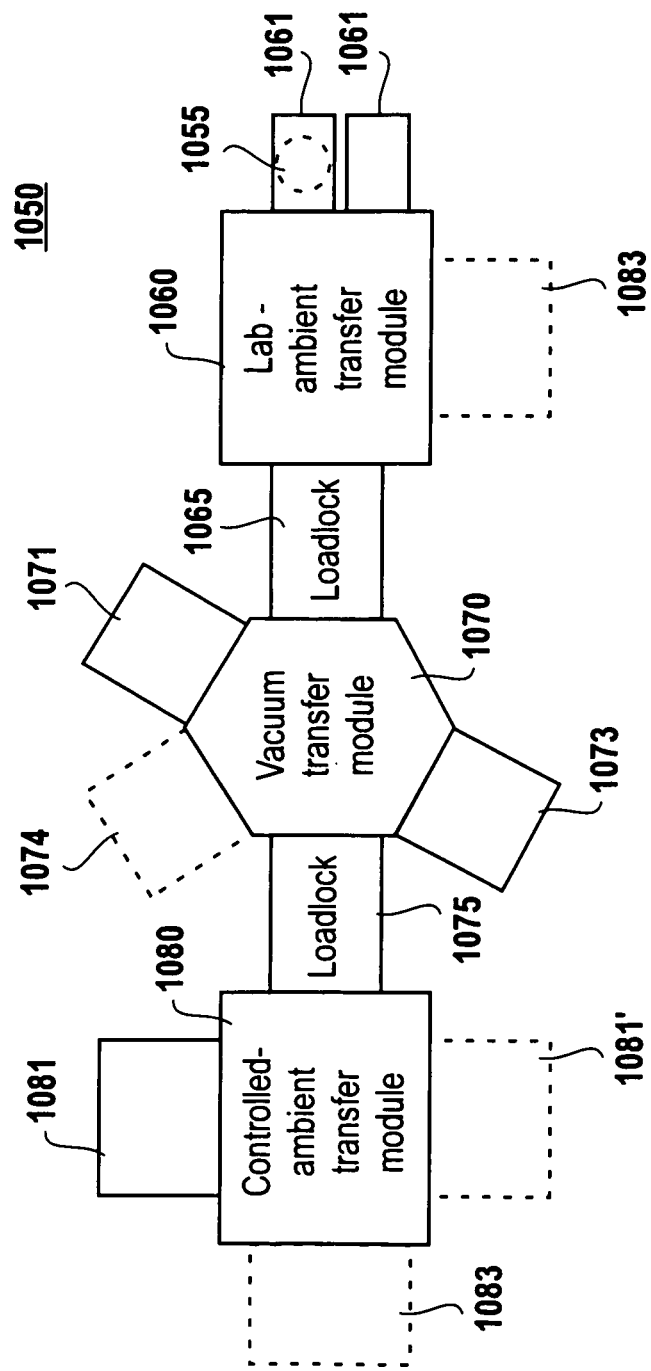
FIG. 10B shows an exemplary system used to process a substrate through a process flow of FIG. 10A.

FIG. 10B shows an embodiment of a schematic diagram of an integrated system 1050 that allows minimal exposure of substrate surface to oxygen at critical steps after barrier surface preparation. In addition, since it is an integrated system, the substrate is transferred from one process station immediately to the next process station, limiting the duration that clean copper surface is exposed to low levels of oxygen. The integrated system 1050 can be used to process substrate(s) through the entire process sequence of flow 1000 of FIG. 10A.

As described above, the surface preparation for electroless deposition of copper and the optional post-cobalt-alloy deposition processes involves a mixture of dry and wet processes. The wet processes are typically operated near atmosphere, while the dry plasma processes are operated at less than 1 Torr. Therefore, the integrated system needs to be able to handle a mixture of dry and wet processes. The integrated system 1050 has 3 substrate transfer modules 1060, 1070, and 1080. Transfer modules 1060, 1070 and 1080 are equipped with robots to move substrate 1055 from one process area to another process area. The process area could be a substrate cassette, a reactor, or a loadlock. Substrate transfer module 1060 is operated under lab ambient. Module 1060 interfaces with substrate loaders (or substrate cassettes) 1061 to bring the substrate 1555 into the integrated system or to return the substrate to one of the cassettes 1061.

As described above in process flow 1000, the substrate 1055 is brought to the integrated system 1050 to deposit barrier layer and copper layer. As described in step 1001 of process flow 1000, top tungsten surface 124a of contact 125 is etched to remove native tungsten oxide. Once the tungsten oxide is removed, the exposed tungsten surface 124a of FIG. 9A needs to be protected from exposure to oxygen. If the removal process is an Ar sputtering process, the reactor 1071 is coupled to the vacuum transfer module 1070. If a wet chemical etching process is selected, the reactor should be coupled to the controlled-ambient transfer module 1080, not the lab-ambient transfer module 1060, to limit exposure of the tungsten surface to oxygen.

Afterwards, the substrate is deposited with a metallic barrier layer, such as Ta, TaN, Ru, or a combination of these films, as described in step 1003 of FIG. 10A. The barrier layer 130 of FIG. 9B can be deposited by an ALD process or a PVD process. In one embodiment, the ALD process is operated at less than 1 Torr. The ALD reactor 1073 is coupled to the vacuum transfer module 1070. In another embodiment, the deposition process is a high pressure process using supercritical $CO_2$ and organometallic precursors to form the metal barrier. In yet another embodiment, the deposition process is a physical vapor deposition (PVD) process operating at pressures less than 1 Torr. Details of an exemplary reactor for a high pressure process using supercritical $CO_2$ is described in commonly assigned application Ser. No. 10/357,664, titled "Method and Apparatus for Semiconductor Wafer Cleaning Using High-Frequency Acoustic Energy with Supercritical Fluid", filed on Feb. 3, 2003, which in incorporated herein for reference.

The substrate can undergo an optional reduction process, for example using a hydrogen-containing plasma, as described in step 1005 of FIG. 10A. The hydrogen reduction reactor 1074 can be coupled to the vacuum transfer module 1070. At this stage, the substrate is ready for electroless copper deposition. The electroless copper plating can be performed in an electroless copper plating reactor 1081 to deposit a conformal seed layer. Following the seed layer deposition, copper bulk fill can be performed in the same electroless copper deposition reactor 1081 used to deposit the conformal seed layer, but with a different chemistry to achieve bulk fill. Alternatively, copper bulk fill can be performed in a separate ECP reactor 1081'.

Before the substrate leaves the integrated system 1050, the substrate can optionally undergo a surface cleaning process, which can clean residues from the previous copper deposition process. For example, the substrate cleaning process can be brush clean process. Substrate cleaning reactor 1083 can be integrated with the controlled-ambient transfer module 1080. Alternatively, substrate cleaning reactor 1083 can also be integrated with the lab-ambient transfer module 1060.

Figure 10C:
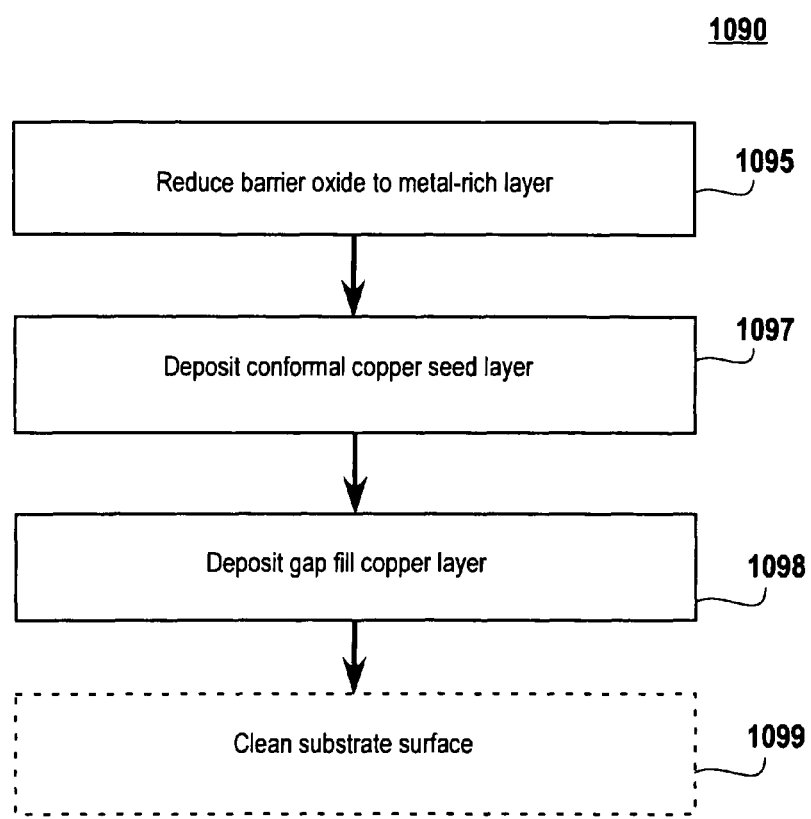
FIG. 10C shows an exemplary process flow to prepare a barrier layer surface for electrolessly depositing a copper layer.

Alternatively, the barrier layer 130 of FIG. 9B can be deposited in a process chamber before the substrate 900 is brought into a system for surface treatment and depositing copper. FIG. 10C shows an embodiment of a process flow 1090 of preparing the barrier (or liner) layer surface for electroless copper deposition. The barrier surface is hydrogen-plasma treated to produce a metal-rich surface on the Ta, TaN, or Ru layer at optional step 1095 to provide a catalytic surface for the subsequent copper seed deposition step. Whether this step is needed or not depends on how metal-rich the surface is.

Afterwards, conformal copper seed is deposited on the barrier surface at step 1097, followed by a thick copper gap fill (or bulk fill) process, 1098. In one embodiment, the conformal copper seed layer can be deposited by an electroless process. The thick copper bulk fill process can be an electroless deposition (ELD) process or an electrochemical plating (ECP) process. After copper deposition at steps 1097 and 1098, the substrate can undergo an optional substrate cleaning at step 1099. Post-copper-deposition clean can be accomplished by using a brush scrub clean with a chemical solution, such as a solution containing CP72B supplied by Air Products and Chemical, Inc. of Allentown, Pa. Other substrate surface cleaning processes can also be used, such as Lam's C3™ or P3™ cleaning technology.

Figure 10D:
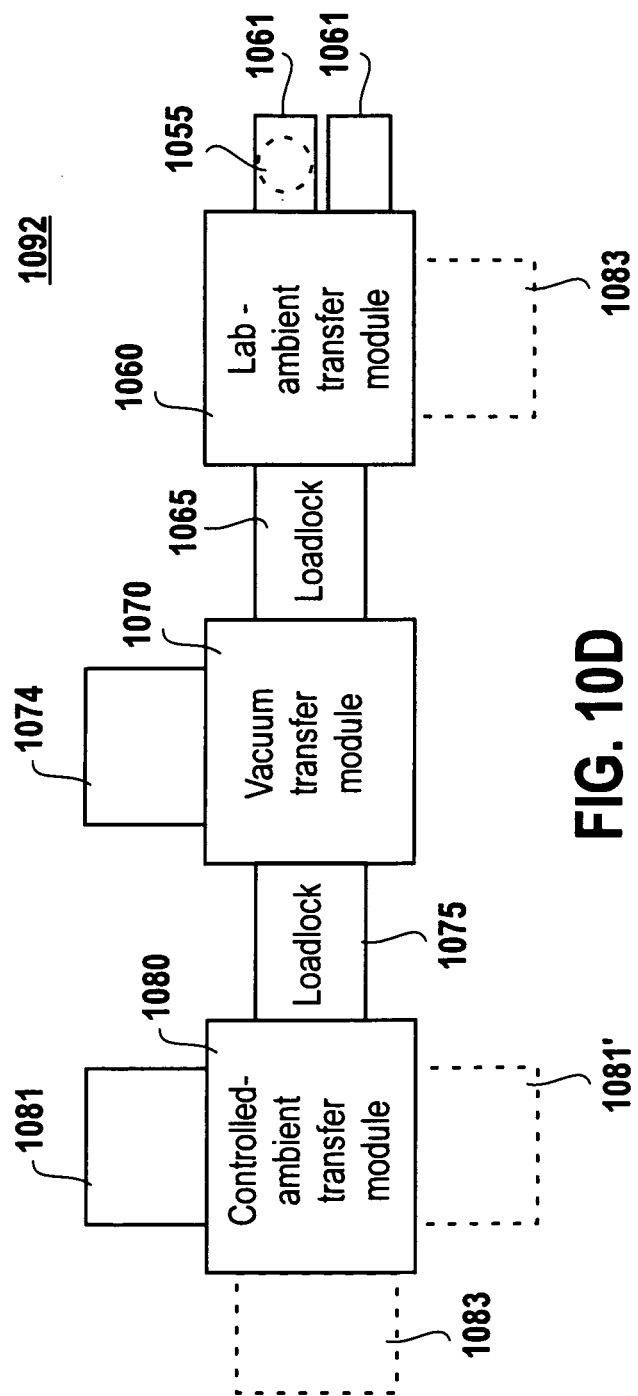
FIG. 10D shows an exemplary system used to process a substrate through a process flow of FIG. 10C.

FIG. 10D shows an embodiment of a schematic diagram of an integrated system 1092 that allows minimal exposure of substrate surface to oxygen at critical steps after barrier surface preparation. In addition, since it is an integrated system, the substrate is transferred from one process station immediately to the next process station, limiting the duration that clean copper surface is exposed to low levels of oxygen. The integrated system 1092 can be used to process substrate(s) through the entire process sequence of flow 1090 of FIG. 10C.

As described above, the surface preparation for electroless deposition of copper and the optional post-cobalt-alloy deposition processes involves a mixture of dry and wet processes. The wet processes are typically operated near atmosphere, while the dry plasma processes are operated at less than 1 Torr. Therefore, the integrated system needs to be able to handle a mixture of dry and wet processes. The integrated system 1092 has 3 substrate transfer modules 1060, 1070, and 1080. Transfer modules 1060, 1070 and 1080 are equipped with robots to move substrate 1055 from one process area to another process area. The process area could be a substrate cassette, a reactor, or a loadlock. Substrate transfer module 1060 is operated under lab ambient. Module 1060 interfaces with substrate loaders (or substrate cassettes) 1061 to bring the substrate 1555 into the integrated system or to return the substrate to one of the cassettes 1061.

As described above in process flow 1090, the substrate 1055 is brought to the integrated system 1092 after the barrier layer is deposited to prepare the barrier surface for electroless copper deposition. The substrate first undergoes a reduction process, for example using a hydrogen-containing plasma, as described in step 1095 of FIG. 10C. The hydrogen reduction reactor 1074 can be coupled to the vacuum transfer module 1070. At this stage, the substrate is ready for electroless copper deposition. The electroless copper plating can be performed in an electroless copper plating reactor 1081 to deposit a conformal seed layer. Following the seed layer deposition, copper bulk fill can be performed in the same electroless copper deposition reactor 1081 used to deposit the conformal seed layer, but with a different chemistry to achieve bulk fill. Alternatively, copper bulk fill can be performed in a separate ECP reactor 1081'.

Before the substrate leaves the integrated system 1092, the substrate can optionally undergo a surface cleaning process, which can clean residues from the previous copper deposition process. For example, the substrate cleaning process can be brush clean process. Substrate cleaning reactor 1083 can be integrated with the controlled-ambient transfer module 1080. Alternatively, substrate cleaning reactor 1083 can also be integrated with the lab-ambient transfer module 1060.

Figure 11A:
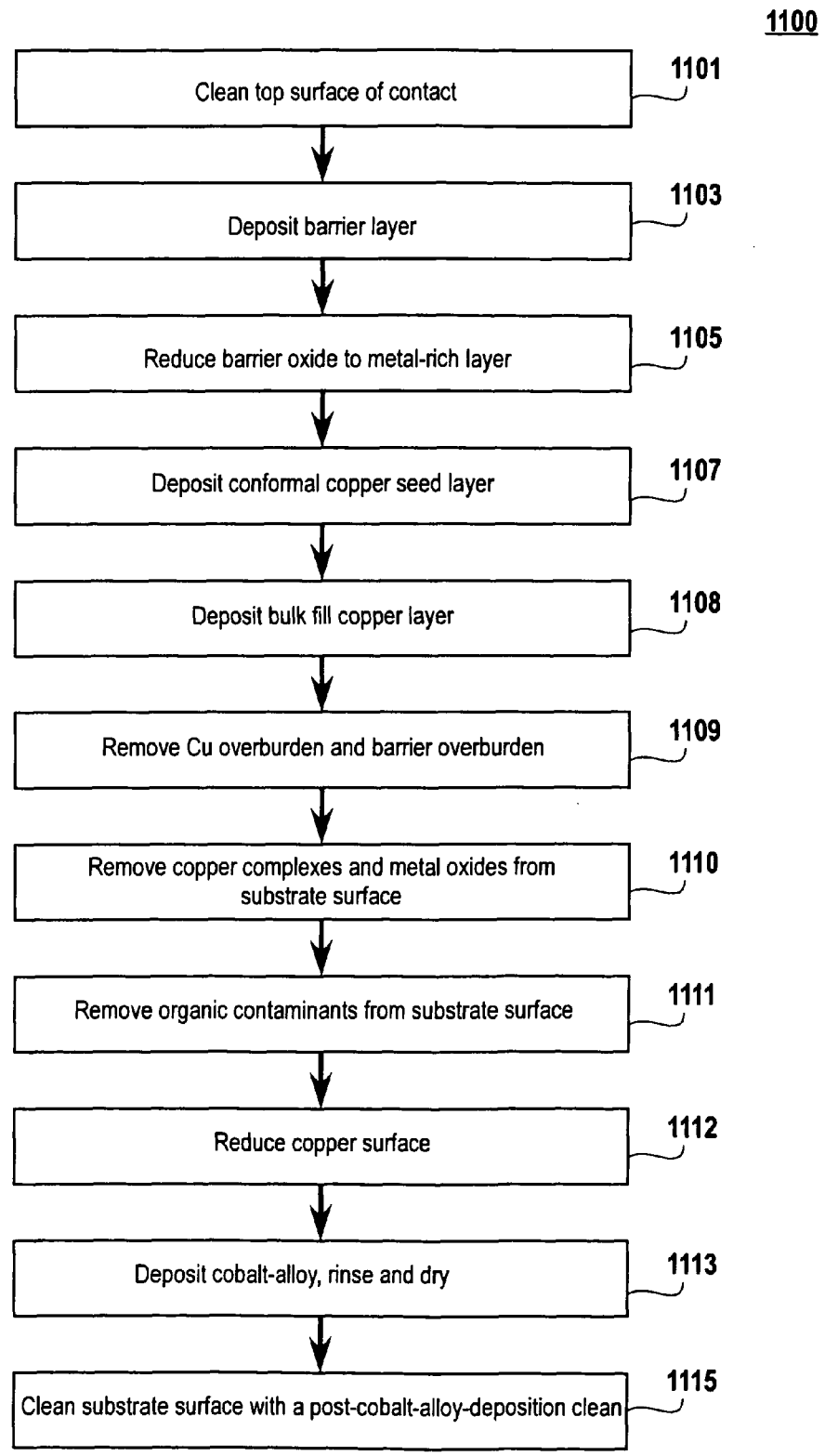
FIG. 11A shows an exemplary process flow to prepare a barrier layer surface for electrolessly depositing a copper layer and to prepare a copper surface for electrolessly depositing a cobalt-alloy.

FIG. 11A shows an embodiment of a process flow of preparing the barrier (or liner) layer surface for electroless copper deposition and preparing the post-CMP copper surface for electroless cobalt-alloy deposition. At step 1101, the top surface 124a of the contact plug is cleaned to remove native tungsten oxide. Metal oxide can be removed by an Ar sputtering process, a plasma reduction process, a reactive ion etch process, or a wet chemical etch process. At step 1103, a barrier layer is deposited. The barrier layer is hydrogen-plasma treated to produce a metal-rich surface on the Ta, TaN or Ru layer at optional step 1005 to provide a catalytic surface for the subsequent copper seed deposition step. Whether this step is needed or not depends on how metal-rich the surface is.

It should be noted, however, that the barrier (or liner) layer may be prepared separately in a non-integrated deposition system, such as an ALD or PVD deposition reactor. In this case, the surface preparation for depositing a thin copper seed layer would not include the metal plug preclean and barrier deposition process steps as described in FIG. 10A, step 1001 and 1003, and FIG. 11A, steps 1101, 1103. In these cases, the process described would commence at step 1005 or 1105.

Afterwards, conformal copper seed is deposited on the barrier surface at step 1107, followed by a thick copper gap fill (or bulk fill) process, 1108. In one embodiment, the conformal copper seed layer can be deposited by an electroless process. The thick copper bulk fill process can be an electroless deposition process (ELD) or an electrochemical plating (ECP) process. Electroless copper deposition and ECP are well-known wet processes. For a wet process to be integrated in a system with controlled processing and transporting environment, which has been described above, the reactor needs to be integrated with a rinse/dryer to enable dry-in/dry-out process capability. In addition, the system needs to be filled with inert gas to ensure minimal exposure of the substrate to oxygen. Recently, a dry-in/dry-out electroless copper process has been developed. Further, all fluids used in the process are de-gassed, i.e. dissolved oxygen is removed by commercially available degassing systems.

After the substrate is deposited with conformal copper seed at step 1107, and thick Cu gap fill (bulk fill) by either an electroless or electro-plating process at step 1108, the copper layer 132 is removed from the substrate surface above barrier layer 130 over dielectric 106 at step 1109, as shown in FIG. 9D. Barrier layer is removed afterwards. Both removal processes are performed in process step 1109 of FIG. 11A. Removing copper from the surface above barrier layer can be accomplished by CMP, which is a wet process. Barrier layer can be removed by using a reactive ion etch, such as $CF_4$-plasma, O2/Ar sputtering, CMP, or a wet chemical etch. These barrier etch processes have been described previously.

After barrier layer removal, a cleaning process to remove Cu-BTA complexes and metal oxides (step 1110) and an organic contaminants removal process (step 1111) are performed to remove contaminants from the substrate surface. Details of substrate surface cleaning using these two steps after metal CMP have been described above.

After substrate surface is removed of surface contaminants, the substrate is treated with a reducing plasma (hydrogen-containing) to reduce all residual metal oxide into metal at step 1112. After hydrogen reduction, the copper surface is very clean and catalytic, and is ready for electroless deposition of the cobalt-alloy. At step 1113, the substrate undergoes electroless deposition of cobalt-alloy with a rinse and dry of substrate. The last process step 1115 is an optional substrate-cleaning step to clean any residual contaminants from the previous electroless cobalt-alloy deposition.

Figure 11B:
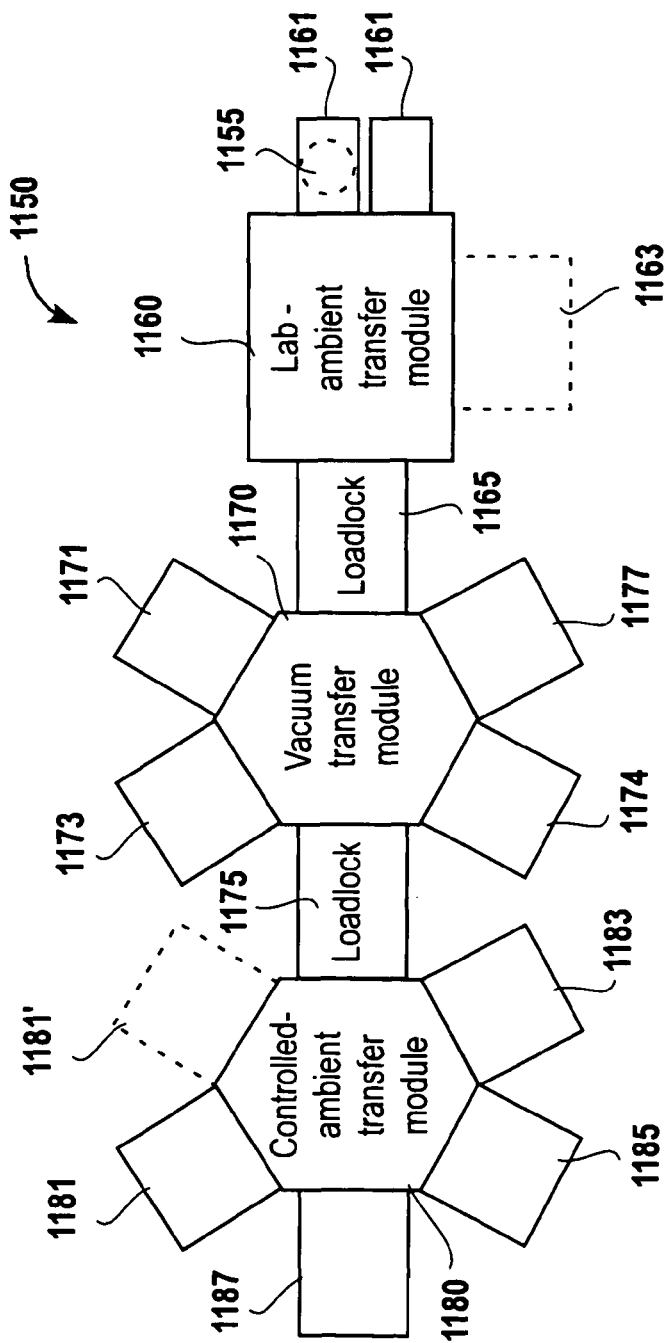
FIG. 11B shows an exemplary system used to process a substrate through a process flow of FIG. 11A.

FIG. 11B shows an embodiment of a schematic diagram of an integrated system 1150 that allows minimal exposure of substrate surface to oxygen at critical steps after barrier and copper surface preparation. In addition, since it is an integrated system, the substrate is transferred from one process station immediately to the next process station, which limits the duration that clean copper surface is exposed to low levels of oxygen. The integrated system 1150 can be used to process substrate(s) through the entire process sequence of flow 1100 of FIG. 11A.

The integrated system 1150 has 3 substrate transfer modules 1160, 1170, and 1180. Transfer modules 1160, 1170 and 1180 are equipped with robots to move substrate 1155 from one process area to another process area. The process area could be a substrate cassette, a reactor, or a loadlock. Substrate transfer module 1160 is operated under lab ambient. Module 1160 interfaces with substrate loaders (or substrate cassettes) 1161 to bring the substrate 1155 into the integrated system or to return the substrate to one of the cassettes 1161.

As described above in process flow 1100 of FIG. 11A, the substrate 1155 is brought to the integrated system 1150 to deposit barrier layer, to prepare barrier surface for copper layer deposition, and to prepare post-CMP copper surface for electroless cobalt-alloy deposition. As described in step 1101 of process flow 1100, top metal plug surface 124a of contact 125 is etched to remove native metal oxide. Alternatively, the metal plug surface oxide can be removed using a reducing plasma, such as a hydrogen-containing plasma. Once the metal plug surface oxide is removed, the exposed metal surface 124a of FIG. 9A needs to be protected from exposure to oxygen. If the removal process is an Ar sputtering process, the Ar sputtering reactor 1171 is coupled to the vacuum transfer module 1170. If a wet chemical etching process is selected, the reactor should be coupled to the controlled-ambient transfer module 1180, not the lab-ambient transfer module 1160, to limit the exposure of the clean metal plug surface to oxygen.

Afterwards, the substrate is deposited with a metallic barrier layer, such as Ta, Ru, TaN, or a combination of these films, as described in a step 1103 of FIG. 11A. The barrier layer 130 of FIG. 9B can be deposited by an ALD process or a PVD process. In one embodiment, the ALD process is operated at less than 1 Torr. The ALD reactor 1173 is coupled to the vacuum transfer module 1170. In another embodiment, the deposition process is a high pressure process using super-critical $CO_2$ and organometallic precursors to form the metal barrier. In yet another embodiment, the deposition process is a physical vapor deposition (PVD) process operating at pressures less than 1 Torr. The substrate can undergo an optional reduction process, for example using a hydrogen-containing plasma, as described in step 1105 of FIG. 11A. The hydrogen reduction reactor 1174 can be coupled to the vacuum transfer module 1170. At this stage, the substrate is ready for electroless copper deposition. The electroless copper plating can be performed in an electroless copper plating reactor 1181 to deposit a conformal seed layer. Following the seed layer deposition, copper bulk fill can be performed in the same electroless copper deposition reactor 1181 used to deposit the conformal seed layer, but with a different chemistry to achieve bulk fill. Alternatively, copper bulk fill can be performed in a separate ECP reactor 1181'.

Afterwards, the substrate is removed of copper overburden and barrier overburden, as described in step 1109 of FIG. 11A. The removal of copper overburden and barrier overburden can be accomplished in one CMP system 1183, or in two CMP systems. In the embodiment shown in FIG. 11A, only one CMP system 1183 is used. After CMP removal of copper and barrier overburdens, the substrate surface needs to be cleaned to remove surface contaminants. Wet clean system 1185 is used to remove copper BTA complexes and metal oxides. $O_2$ plasma system 1177 is used to remove organic contaminants. In one embodiment, $O_2$ plasma process to remove organic contaminants can be performed in the hydrogen reduction chamber 1174.

After the removal of contaminants, the substrate undergoes a reduction process, as described in step 1112 of FIG. 11A. The hydrogen reduction process can occur in the same reduction reactor 1174 used to reduce the barrier surface to be Ta-rich. Following hydrogen reduction treatment, the copper surface is ready for electroless cobalt-alloy deposition, which can be performed in reactor 1187.

Before the substrate leaves the integrated system 1150, the substrate can optionally undergo a surface cleaning process, which can clean residues from the previous copper plating process. The substrate cleaning process can be brush clean process, whose reactor 1163 can be integrated with the lab-ambient transfer module 1160.

Figure 15A:
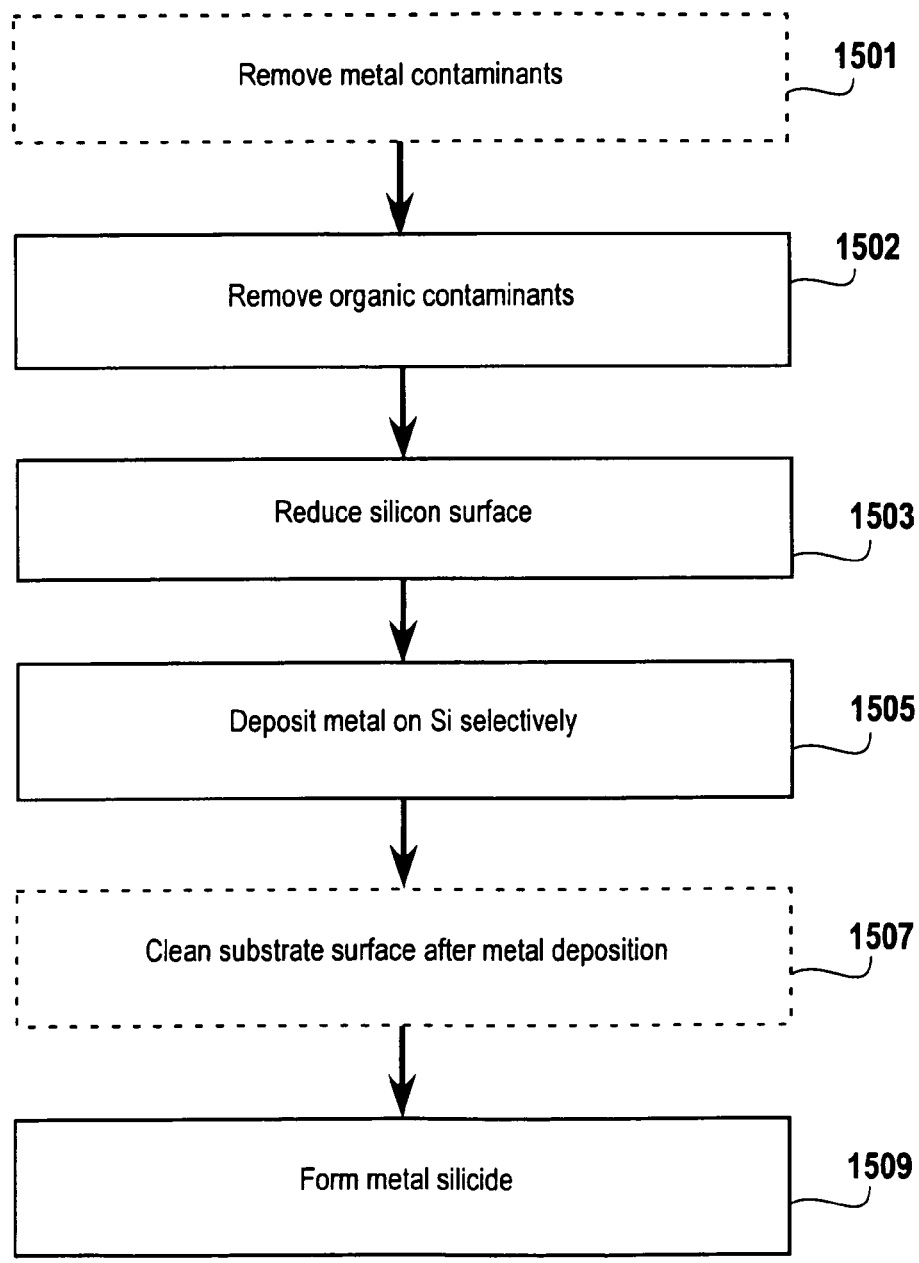
FIG. 15A shows an exemplary process flow to prepare exposed silicon surface to form a metal silicide.
Figure 15B:
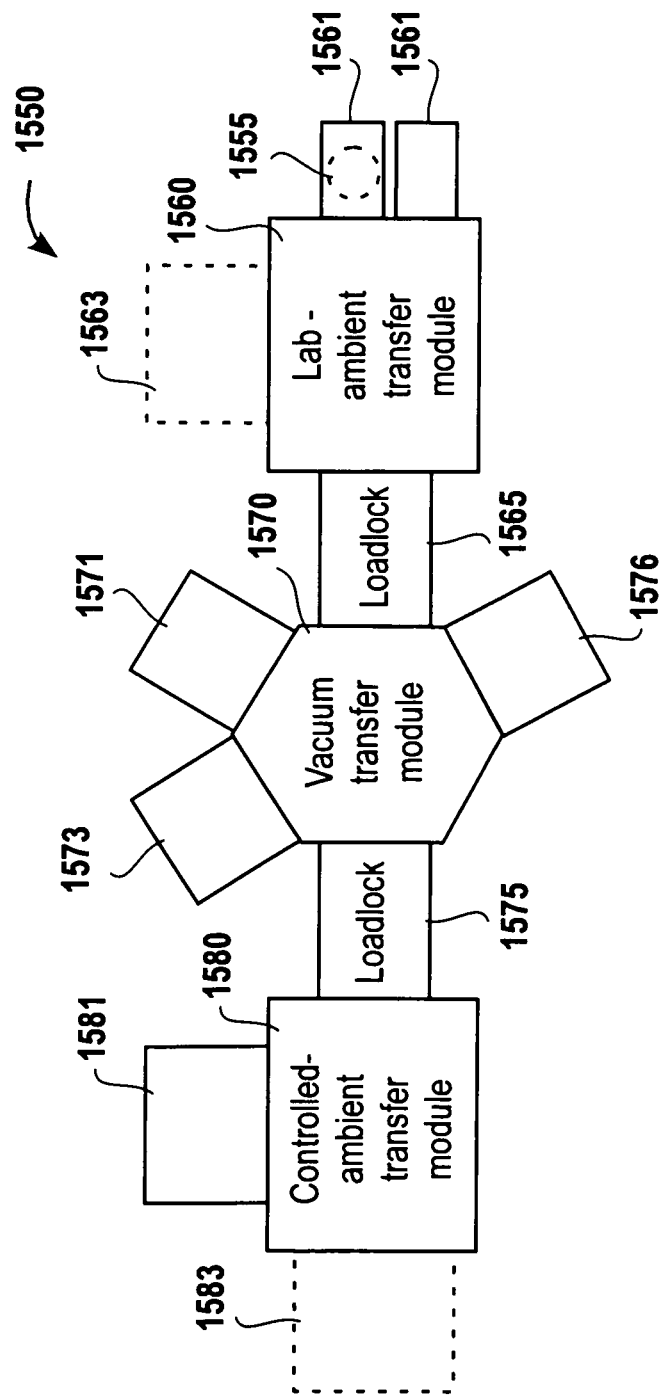
FIG. 15B shows an exemplary system used to process a substrate through a process flow of FIG. 15A.

The wet processing systems described in FIG. 15B, which are coupled to the controlled-ambient transfer module 1180, all need to meet the requirement of dry-in/dry-out to allow system integration.

Case II: Dual Damascene Interconnect Sequence

Figure 12A:
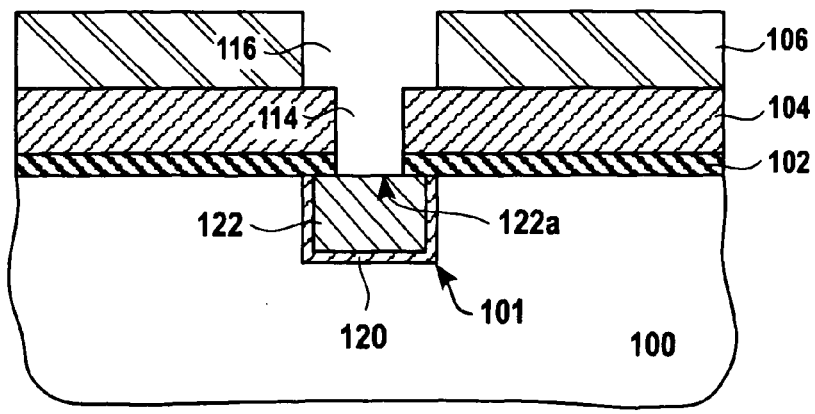
FIGS. 12A-12D show cross sections of an interconnect structure at various stages of processing.

FIG. 12A shows an exemplary cross-section of an interconnect structure after being patterned by a dual damascene process. The interconnect structure(s) is on a substrate 1200 and has an oxide layer 100, which was previously fabricated to form a metallization line 101 therein. The metallization line is typically fabricated by etching a trench into the oxide 100 and then filling the trench with conductive material, such as copper.

In the trench, there is a barrier layer 120, used to prevent the copper material 122 from diffusing into the oxide 100. The barrier layer 120 can be made of tantalum nitride (TaN), tantalum (Ta), ruthenium (Ru), or a combination of these films. Other barrier layer materials can also be used. A barrier layer 102 is deposited over the copper material 122 to provide an etch stop during the via etch process, and to act as a diffusion barrier between dielectric layers for the copper. The barrier layer 102 can be made of materials such as silicon nitride (SiN) or silicon carbide (SiC) or other materials suitable for integration into the dual Damascene process flow.

A via dielectric layer 104 is deposited over the barrier layer 102. The via dielectric layer 104 can be made of inorganic dielectric materials such as silicon dioxide, or preferably low-K dielectric materials. Exemplary dielectrics can include an un-doped TEOS silicon dioxide, fluorinated silica glass (FSG), organo-silicate glass (OSG), porous OSG, commercially available dielectric materials include Black Diamond (I) and Black Diamond (II), Coral, Aurora. After the via dielectric layer 104 is deposited, a patterning and etching process is used to form the via holes 114. The copper surface 122a is protected by the dielectric barrier layer, such as SiC or $Si_3N_4$. FIG. 12A shows the dual Damascene structure after the formation of via holes 114, and trenches 116. The dielectric barrier layer 101 under via holes 114 has been removed.

Figure 12B:
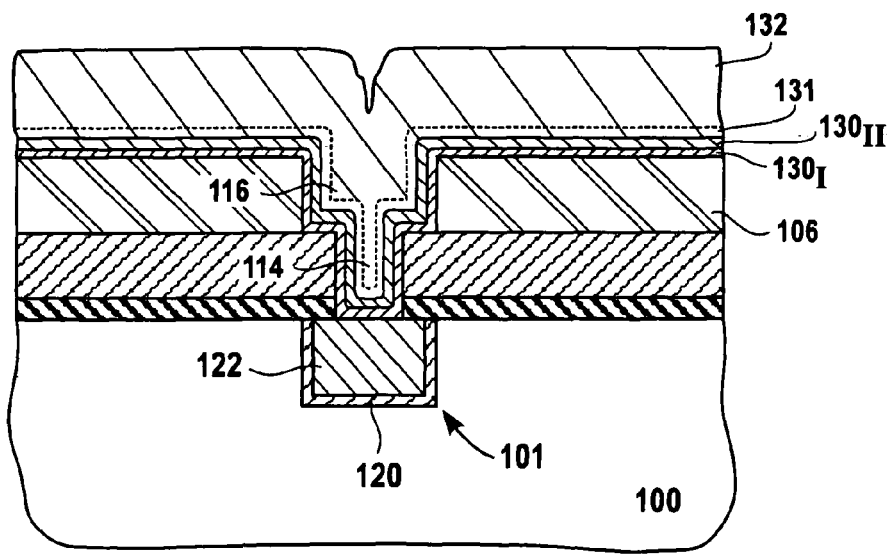

FIG. 12B shows that after the formation of via holes 114 and trenches 116, a first barrier layer $130_I$, a second barrier layer $130_{II}$, and a copper layer 132 are deposited to line the via holes 114' and the trenches 116. Both barrier layers $130_I$, $130_{II}$ can be made of tantalum nitride (TaN), tantalum (Ta), or ruthenium (Ru). Other barrier layer materials can also be used. In one embodiment, the first barrier layer $130_I$, is a thin TaN layer deposited by ALD and the second barrier layer $130_{II}$ is a very thin Ta layer deposited by flash PVD or Ru layer deposited by ALD or PVD. In one embodiment, the thickness of the first barrier layer $130_I$ is between about 10 angstroms to about 150 angstroms and the thickness of the second barrier layer $130_{II}$ is between about 10 angstroms to about 50 angstroms. The thin ALD TaN layer provides conformal coverage of a barrier layer over the via 114' and trench 116. The thin PVD Ta or Ru layer provides good adhesion to the copper film 132 to be deposited over the barrier layers $130_I$ and $130_{II}$. Typically, barrier layer deposited by PVD process does not have good step coverage (or the film is not conformal). Therefore, an ALD barrier is needed to ensure good barrier coverage inside via and trench. In another embodiment, the first barrier layer $130_I$ and the second barrier layer $130_{II}$ is combined into one single layer, which can be deposited by ALD or by PVD. The material of this single layer barrier can be tantalum, tantalum nitride, ruthenium, or a combination of these films.

After the deposition of the first and second barrier layers $130_I$, $130_{II}$, the substrate undergoes previously described requite surface treatment steps to ensure the barrier surface is Ta-rich. A copper film 132 is then deposited, either using a PVD seed 131 or electroless seed 131 followed by a thick gap-fill copper layer to fill the via holes 114 and the trenches 116.

Figure 12C:
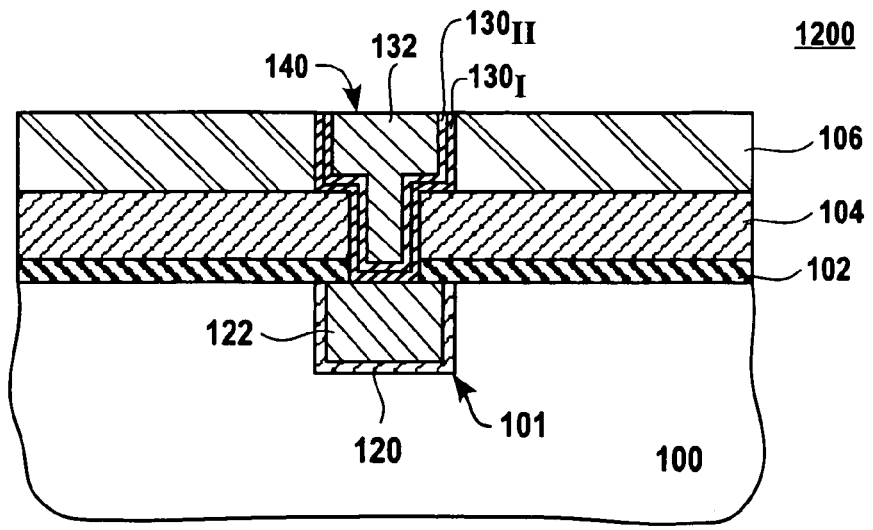
Figure 12D:
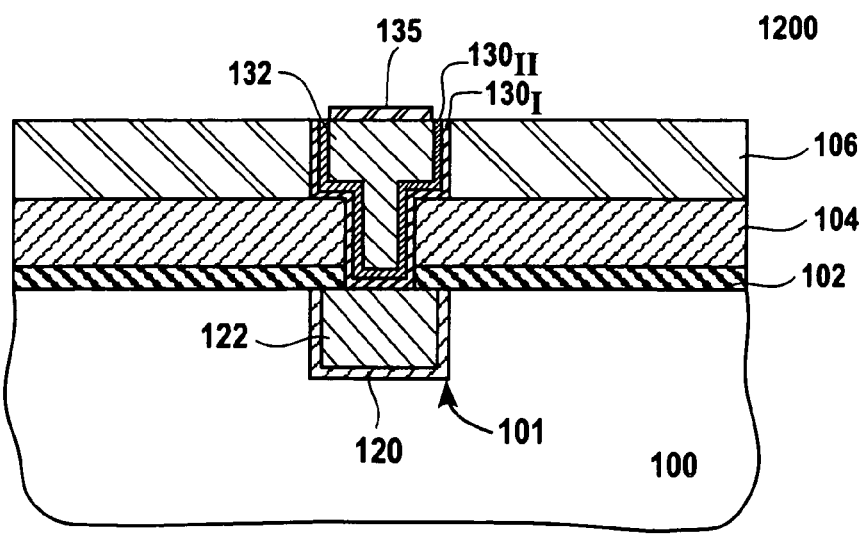

After copper film 132 fills the via holes 114 and trenches 116, substrate 1200 is planarized to remove the copper material (or copper overburden) and barrier layer (or barrier overburden) over the surface of dielectric 106, as shown in FIG. 12C. The substrate then undergoes previously described requite surface treatment steps to ensure the substrate surface is clean and the copper surface is removed of copper oxide. The next step is to cap the copper surface 140 with a copper/SiC interface adhesion promoter layer 135, such as a cobalt-alloy, as shown in FIG. 16D. Examples of the cobalt-alloy include: CoWP, CoWB, or CoWBP, which can be selectively deposited over copper by an electroless process. The thickness of the adhesion promoter layer can be as thin as a monolayer, which is only a few angstroms, to a thicker layer, such as 200 angstroms.

Figure 13A:
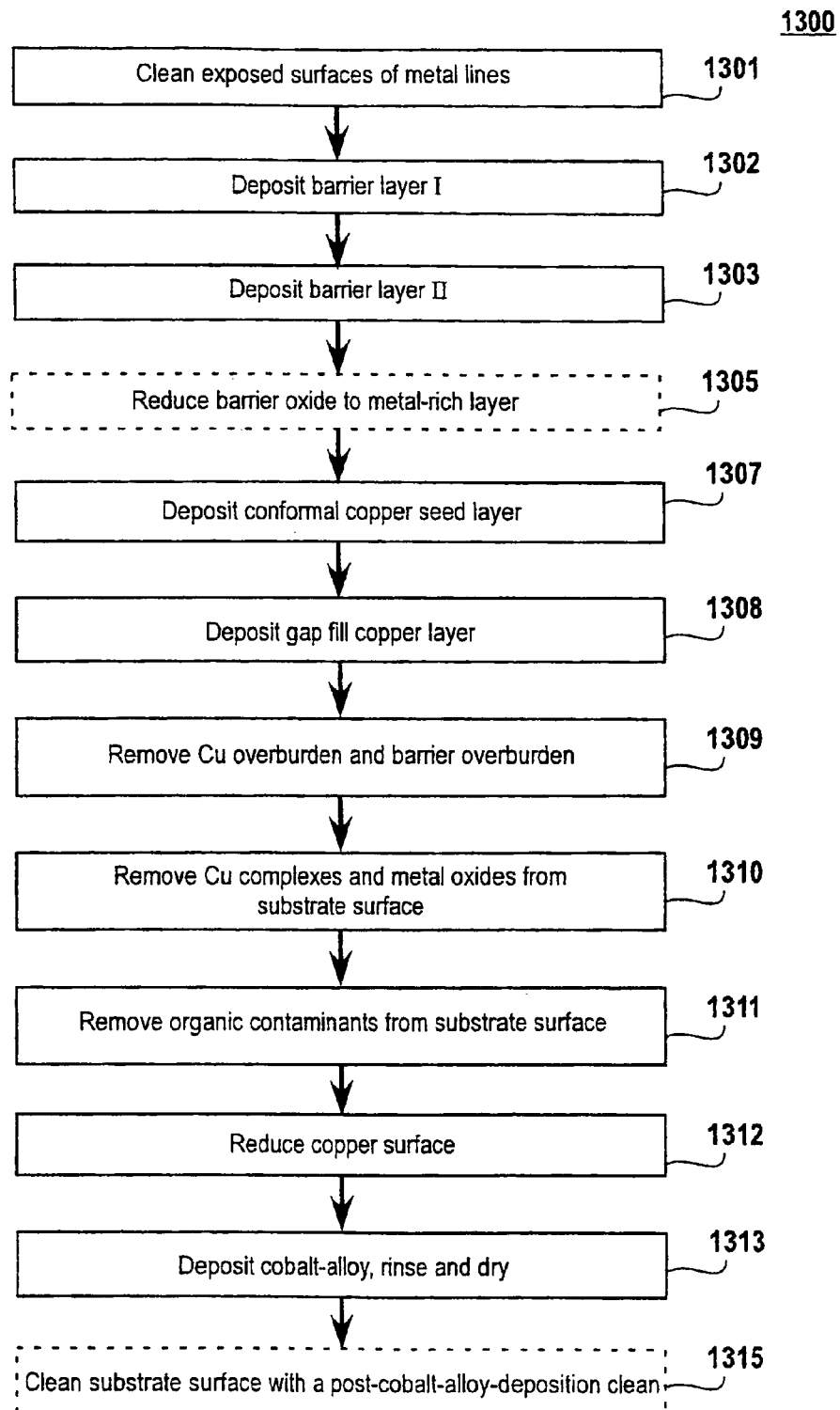
FIG. 13A shows an exemplary process flow to prepare a barrier surface for electroless copper deposition and to prepare a copper surface for electrolessly depositing a cobalt-alloy.

FIG. 13A shows an embodiment of a process flow of preparing the barrier (or liner) layer surface for electroless copper deposition and preparing the post-CMP copper surface for electroless cobalt-alloy deposition. At step 1301, the top surface 122a of the metal lines 101 is cleaned to remove native copper oxide. Copper oxide can be removed by an Ar sputtering process or a wet chemical etch process. At step 1302, a first barrier layer ($130_I$ of FIG. 12B) is deposited in an ALD system. At step 1303, a second barrier layer (130II of FIG. 12B) is deposited in a PVD system. As described above, preventing the barrier layer from exposure to oxygen is critical in ensuring that electroless copper is being deposited on the barrier layer with good adhesion between copper and the barrier layer. Once the barrier layer is deposited, the substrate should be transferred or processed in a controlled-ambient environment to limit exposure to oxygen. The barrier layer is treated by a reducing plasma (i.e. hydrogen-containing) at step 1305 to produce a metal-rich layer that will provide a catalytic surface for the subsequent copper seed deposition step. The reducing plasma treatment is optional, depending on the composition of the surface.

Afterwards, a conformal copper seed is deposited on the barrier surface at step 1307, followed by a thick copper bulk fill (or gap fill) process, 1308. The conformal copper seed layer can be deposited by an electroless process. The thick copper bulk fill (also gap fill) layer can be deposited by an ECP process. Alternatively, the thick bulk fill (also gap fill) layer can be deposited by an electroless process in the same electroless system for conformal copper seed, but with a different chemistry.

After the substrate is deposited with conformal copper seed at step 1307, and thick Cu bulk fill by either an electroless or electro-plating process at step 1308, the copper layer 132 is removed from the substrate surface above barrier layer 130 over dielectric 106 at step 1309, as shown in FIG. 11C. Barrier layer is removed afterwards. Both removal processes are performed in process step 1309 of FIG. 13A. Removing copper from the surface above barrier layer can be accomplished by CMP, which is a wet process. Barrier layer can be removed by using $CF_4$ plasma, O2/Ar sputtering, CMP, or a wet chemical etch. These barrier etch processes have been described previously.

After barrier layer removal, a cleaning process to remove Cu-BTA complexes and metal oxides (step 1310) and an organic contaminants removal process (step 1311) are performed to remove contaminants from the substrate surface. Details of substrate surface cleaning using these two steps after metal CMP have been described above.

After substrate surface is removed of surface contaminants, the substrate is treated with a reducing plasma, for example a hydrogen-containing plasma, to reduce all residual metal oxide into metal at step 1312. After hydrogen reduction, the copper surface is very clean and catalytic, and is ready for electroless deposition of the cobalt-alloy. At step 1313, the substrate undergoes electroless deposition of cobalt-alloy with a rinse and dry of substrate. The last process step 1315 is an optional substrate-cleaning step to clean any residual contaminants from the previous electroless cobalt-alloy deposition.

Figure 13B:
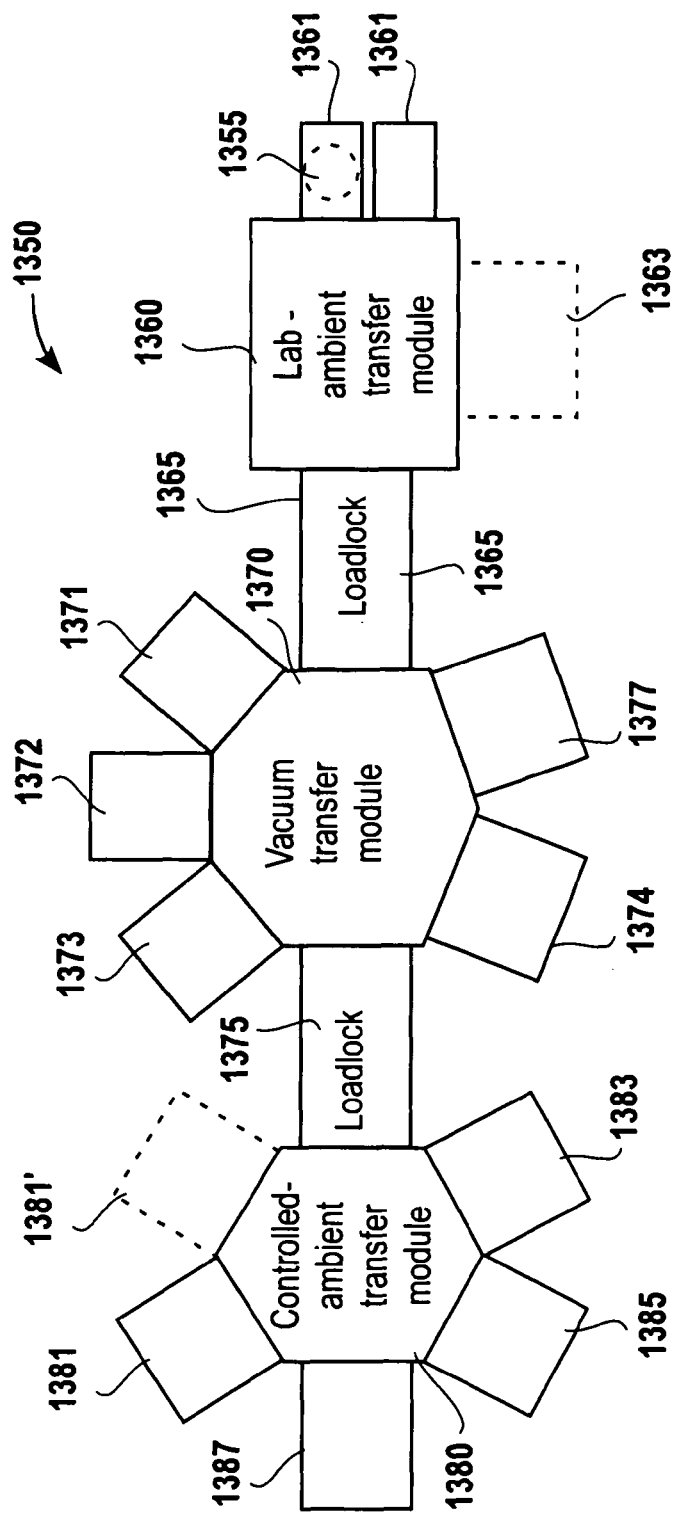
FIG. 13B shows an exemplary system used to process a substrate through a process flow of FIG. 13A.

FIG. 13B shows an embodiment of a schematic diagram of an integrated system 1350 that allows minimal exposure of substrate surface to oxygen at critical steps after barrier and copper surface preparation. In addition, since it is an integrated system, the substrate is transferred from one process station immediately to the next process station, which limits the duration that clean copper surface is exposed to low levels of oxygen. The integrated system 1350 can be used to process substrate(s) through the entire process sequence of flow 1300 of FIG. 13A.

The integrated system 1350 has 3 substrate transfer modules 1360, 1370, and 1380. Transfer modules 1360, 1370 and 1380 are equipped with robots to move substrate 1355 from one process area to another process area. The process area could be a substrate cassette, a reactor, or a loadlock. Substrate transfer module 1360 is operated under lab ambient.

Module 1360 interfaces with substrate loaders (or substrate cassettes) 1361 to bring the substrate 1355 into the integrated system or to return the substrate to one of the cassettes 1361.

As described above in process flow 1300 of FIG. 11A, the substrate 1355 is brought to the integrated system 1350 to deposit barrier layer, to prepare barrier surface for copper layer deposition, and to prepare post-CMP copper surface for electroless cobalt-alloy deposition. As described in step 1301 of process flow 1300, top copper surface 122a of metal lines 101 is etched to remove native copper oxide. Once the copper oxide is removed, the exposed tungsten surface 122a of FIG. 12A needs to be protected from exposure to oxygen. If the removal process is an Ar sputtering process, the Ar sputtering reactor 1371 is coupled to the vacuum transfer module 1370. If a wet chemical etching process is selected, the reactor should be coupled to the controlled-ambient transfer module 1380, not the lab-ambient transfer module 1360, to limit the exposure of the clean tungsten surface to oxygen.

Afterwards, the substrate is deposited with first and second barrier layers. The first barrier layer 130, of FIG. 12B is deposited by an ALD process, which is a dry process and is operated at less than 1 Torr. The ALD reactor 1372 is coupled to the vacuum transfer module 1370. The second barrier layer 130$_{II}$ of FIG. 12B is deposited by a PVD or ALD process, which is a dry process and is operated at less than 1 Torr. The PVD reactor 1373 is coupled to the vacuum transfer module 1370. The substrate can undergo an optional hydrogen reduction process to ensure the barrier layer surface is metal-rich for electroless copper deposition. The hydrogen reduction reactor 1374 can be coupled to the vacuum transfer module 1370. At this stage, the substrate is ready for electroless copper deposition. The electroless copper plating can be performed in an electroless copper plating reactor 1381 to deposit a conformal copper seed layer, as described in step 1307 of FIG. 13A. As described above, the deposition of the gap fill copper layer at step 1308 of FIG. 13A can be deposited in the same electroless plating reactor 1381 with different chemistry, or in a separate ECP reactor 1381'.

Afterwards, the substrate is removed of copper overburden and barrier overburden, as described in step 1309 of FIG. 13A. The removal of copper overburden and barrier overburden can be accomplished in one CMP system 1383, or in two CMP systems. In the embodiment shown in FIG. 13A, only one CMP system 1383 is used. After CMP removal of copper and barrier overburden, the substrate surface needs to be cleaned to remove surface contaminants. Wet clean system 1385 is used to remove copper BTA complexes and metal oxides. $O_2$ plasma system 1377 is used to remove organic contaminants. In one embodiment, $O_2$ plasma process to remove organic contaminants can be performed in the hydrogen reduction chamber 1374.

After the removal of contaminants, the substrate undergoes a reduction process, as described in step 1312 of FIG. 13A. The hydrogen reduction process is used to reduce copper oxide to copper and can occur in the same reduction reactor 1374 used to reduce the barrier surface to be Ta-rich. Following hydrogen reduction treatment, the copper surface is ready for electroless cobalt-alloy deposition, which can be performed in reactor 1387.

Before the substrate leaves the integrated system 1350, the substrate can optionally undergoes a surface cleaning process, which can clean residues from the previous copper plating process. The substrate cleaning process can be brush clean process, whose reactor 1163 can be integrated with the lab-ambient transfer module 1360.

The wet processing systems described in FIG. 13B, which are coupled to the controlled-ambient transfer module 1380, all need to meet the requirement of dry-in/dry-out to allow system integration.

The apparatus and methods (or processes) described above apply to preparing metal surface for subsequent metal deposition to improve metal-to-metal adhesion and EM performance. The inventive concept can also apply to preparing silicon surface for subsequent selective metal layer deposition.

Figure 14A:
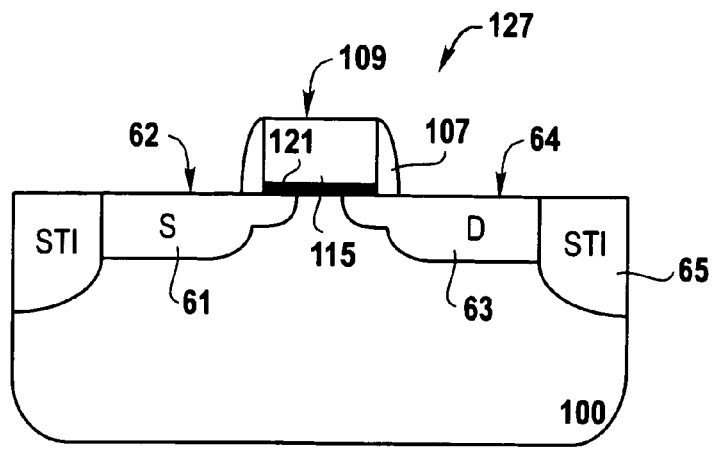
FIGS. 14A-14D show cross section of a gate structure at various stages of forming metal silicide.

3. Engineering a Silicon Surface for Selective Electroless Metal Deposition to Form Metal Silicide The processes described so far are used to improve the EM performance, metal resistivity, and even yield for copper interconnects, such as contacts, vias and metal lines. Earlier in the fabrication sequence of ICs, another metal deposition is applied on silicon or polysilicon surface to form metal silicide in the source/drain/gate, resistor, contact-landing regions (such as resistor contact landing region) of structures, gate region, capacitor region or inductor region of the device to reduce contact resistance and provide good ohmic contact. FIG. 14A is a cross section of a gate structure 127 that includes a thin gate oxide 121, a polysilicon layer 105 and a nitride spacer 107 on a silicon substrate 110. Shallow trench isolation (STI) 65 is used to separate active devices. On two sides of the gate structure are source area 61 and drain area 63. On the source area 61, there is an exposed silicon surface 62. On the drain area 63, there is an exposed silicon surface 64. On the polysilicon layer 105, there is an exposed polysilicon 109. Metal silicide is formed to reduce sheet resistance.

Figure 14B:
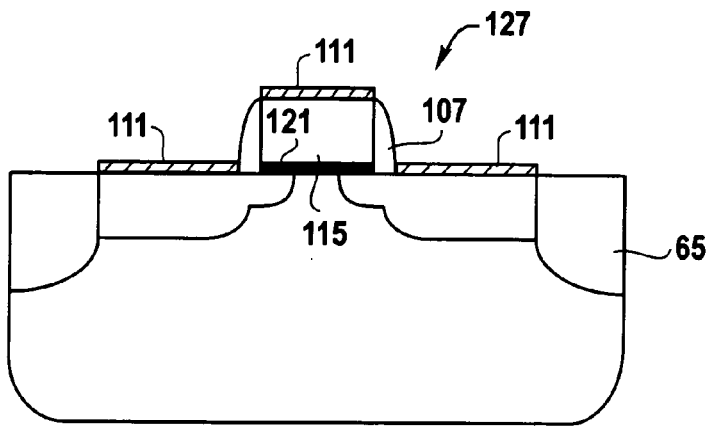
Figure 14C:
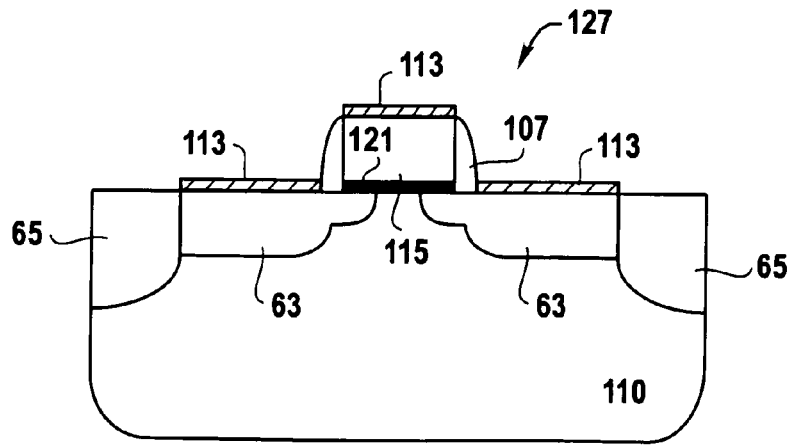
Figure 14D:
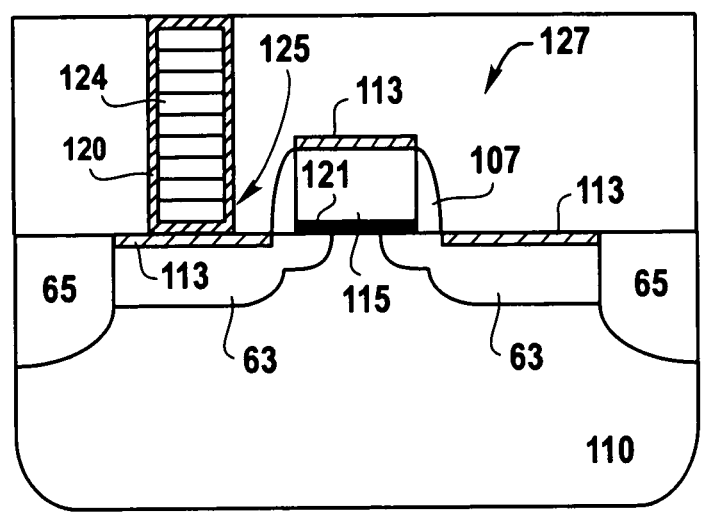

To form metal silicide, a metal 111, such as nickel (Ni), titanium (Ti), or cobalt (Co), is first deposited on the silicon surface, as shown in FIG. 14B. Currently, metal 111 is deposited on the substrate surface by a PVD process, and is not selective to the silicon or dielectric regions. The metal is then annealed to form the metal-silicon alloy (silicide) in regions where the metal is in contact with the silicon or polysilicon substrate. No silicide is formed in the dielectric regions. Un-reacted metal is removed selectively to the silicide, including metal in the dielectric regions as well as remaining un-reacted metal above the silicided regions. Electroless metal deposition can be an alternative process to replace the current Co or Ni deposition process. The advantages are that the metal-silicide layer can be made thicker and provide improved etch stop characteristics as well as allow metal-metal contact formation. To enable electroless metal deposition, the silicon surface needs to be very clean and free of native silicon oxide. After metal 111 is selectively deposited on silicon surfaces 62, 64, the substrate is thermally treated at high temperature, such as between about 800° C. to about 900° C., to form metal silicide 113, as shown in FIG. 14C. The metal silicide 113 formed can allow contact 125 to electrically communicate with the drain area 61, as shown in FIG. 14D.

As describe above, the surface preparation prior to electroless metal deposition needs to be conducted in a controlled-ambient environment to ensure the surface on which will be performed electroless deposition is not exposed to oxygen. FIG. 15A show an embodiment for a process flow 1500 used to form metal silicide. At step 1501, metal contaminants are removed from all dielectric surfaces; this can be performed using known methods and chemistries. Step 1501 is an optional step, which is needed only when there is concern of surface metal contamination. Organic contaminants are next removed from substrate surface, step 1502. As mentioned above, organic contaminants can be removed by either a variety of dry or wet processes. Afterwards, at step 1503 the silicon surface is reduced to convert native silicon oxide to silicon. Native silicon oxide is a self-limiting process; therefore, the oxide layer is quite thin and does not need an oxide removal step prior to the reduction process. As described above, the reduction process can be a hydrogen plasma process.

After the surface reduction, the silicon surface is ready for electroless metal deposition. A metal, such as Ni, Ti, or Co, is selectively deposited over the exposed silicon (including polysilicon) surface at step 1505. The selective metal deposition can be accomplished by an electroless process. After electroless metal deposition, the substrate undergoes an optional substrate cleaning using known methods and chemistries at step 1507. The substrate then undergoes a high temperature process (or annealing) to form metal silicide at step 1509.

FIG. 15B shows an embodiment of an integrated system 1550 that includes a lab-ambient transfer module 1560, a vacuum transfer module 1950, and a controlled-ambient transfer module 1580. The lab-ambient transfer module 1560 is coupled to cassettes 1561 that hold substrate(s) 1555. In one embodiment, the metal contaminants are removed by a wet clean process, such as one of the wet clean processes used to remove metal contaminants described above. The wet clean can be performed in chamber 1565 coupled to the lab-ambient transfer module 1560. Since this process step is optional, chamber 1565 in FIG. 15B is dotted. Following removal of metal contaminants, organic contaminants are removed. In one embodiment, the organic contaminants are removed in an oxidizing plasma, such as $O_2$, H2O, or ozone plasma, in reactor 1571, coupled to the vacuum transfer module 1570, since the $O_2$ plasma process is a low pressure dry process, operated at pressure less than 1 Torr.

Afterwards, silicon surface reduction at step 1503 of flow 1500 can be performed in reactor 1573. The substrate is then transferred to the next system to be deposited with the metal used to form metal silicide (or silicide metal) in an electroless process reactor 1581. The substrate is transferred from reactor 1573 through vacuum transfer module 1570, loadlock 1575, and controlled-ambient transfer module 1580, and finally arrives in reactor 1581 for processing. The electroless metal deposition reactor 1581 is equipped with a rinse/dry system. The substrate can undergo an optional substrate cleaning after metal deposition in a wet clean chamber 1583, as described in process step 1507 of FIG. 15A. After the electroless deposition, the substrate is sent to a thermal reactor 1576, such as a rapid thermal processing (RTP) reactor, to form metal silicide.

Figure 16:
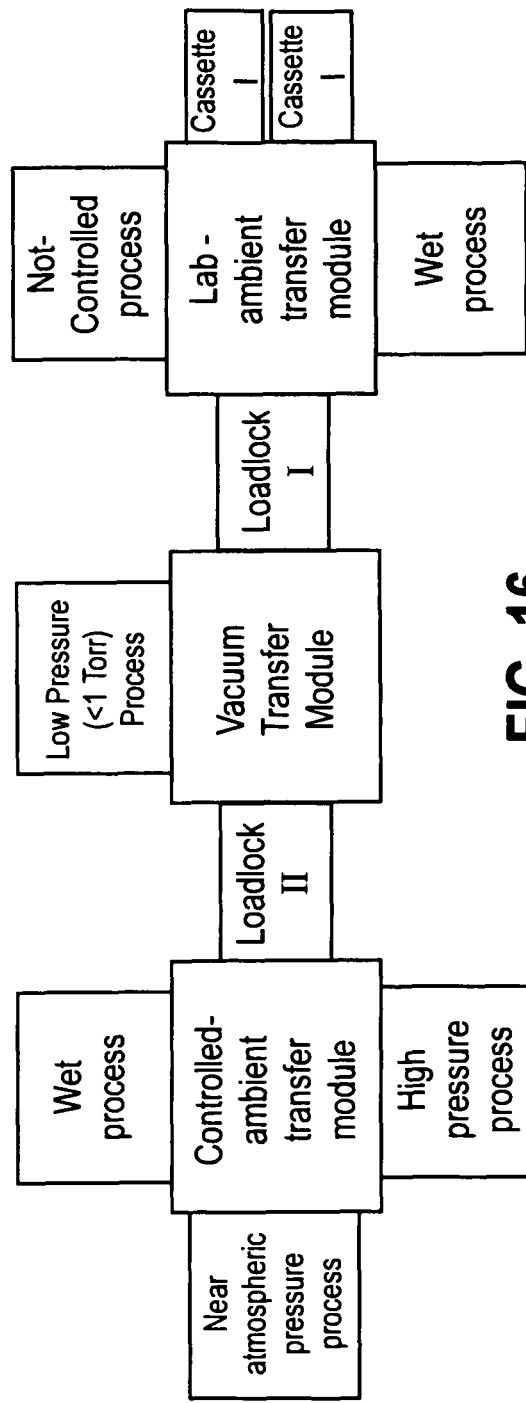
FIG. 16 shows a schematic diagram of system integration for an integrated system with ambient-controlled processing environments.

The systems described above allow substrate processing that requires a mixture of low pressure dry process, high pressure process, and wet processes to be integrated together to limit oxygen exposure at critical processing steps. FIG. 16 shows a schematic diagram that shows how different processes are integrated. The lab-ambient transfer module can integrate with cassettes, wet process (es), and dry process that do not need to limit exposure to oxygen (or not-controlled process). The vacuum transfer module can integrate low-pressure dry processes. The vacuum transfer module is operated under vacuum, such as less than 1 Torr; therefore, the exposure to oxygen is limited and controlled. Loadlock I enables substrate transport between the lab-ambient transfer module and the vacuum transfer module. Controlled-ambient transfer module can integrate wet processes, near atmospheric pressure processes, and high-pressure processes. The term "high pressure" is used to differentiate from low-pressure process. The pressure of the high-pressure process refers to pressure greater than atmospheric pressure process, such as the supercritical $CO_2$ process described previously. In one embodiment, there is a loadlock (not shown) between the high-pressure process chamber and the controlled-ambient transfer module to enable substrate being efficiently transferred between the transfer module and the process chamber. Loadlock II enables substrates to be transferred between the vacuum transfer module and the controlled-ambient transfer module. The controlled-ambient transfer module and the reactors coupled to the controlled-ambient transfer module are filled with inert gas to limit exposure to oxygen. Loadlock II can be pump down to receive substrate from the vacuum transfer module. Loadlock II can also be filled with inert gas to exchange substrate with the controlled-ambient transfer module.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

What is claimed is:

1. A method of preparing a substrate surface of a substrate to selectively deposit a layer of a metal on a silicon or polysilicon surface of the substrate to form a metal silicide in an integrated system configured for performing both dry and wet processes, while maintaining the substrate in the integrated system, performing the operations comprising:

removing organic contaminants from the substrate surface in the integrated system configured for performing both dry and wet processes, wherein the organic contaminants are removed by an oxygen plasma process in an oxygen plasma reactor coupled to a vacuum transfer module, the temperature of the oxygen plasma process is less than about 120° C. to prevent forming a thick silicon oxide layer on the silicon surface;

after removing organic contaminants, moving the substrate from the oxygen plasma reactor to the vacuum transfer module;

moving the substrate from the vacuum transfer module into a hydrogen-containing plasma system coupled to the vacuum transfer module;

reducing the silicon or polysilicon surface in the hydrogen-containing plasma system after removing organic contaminants to convert silicon oxide on the silicon or polysilicon surface to silicon, and wherein the silicon or polysilicon surface is reduced to increase the selectivity of the metal on the silicon surface;

upon completing the reducing in the hydrogen-containing plasma system, moving the substrate into the vacuum transfer module operated under vacuum;

moving the substrate from the vacuum transfer module into a loadlock under vacuum, and providing the loadlock with an inert gas, the loadlock for transferring out of the vacuum transfer module and into a controlled ambient transfer module;

moving the substrate from the loadlock to the controlled ambient transfer module, the controlled ambient transfer module provided with the inert gas;

transferring the substrate in the controlled ambient transfer module, having the inert gas, into an electroless deposition module that is coupled to the controlled ambient transfer module;

selectively depositing the layer of the metal on the silicon or polysilicon surface of substrate through electroless deposition in the electroless deposition module;

wherein the electroless deposition module enables a dry-in/dry-out processing of the substrate, wherein the substrate goes in and comes out the electroless deposition module in a dry state;

after depositing the layer of the metal, moving the substrate from the electroless deposition module into the controlled ambient transfer module;

moving the substrate from the controlled ambient transfer module into the loadlock;

moving the substrate from the loadlock into the vacuum transfer module;

moving the substrate from the vacuum transfer module into a rapid thermal processing (RTP) system that is coupled to the vacuum transfer module;

forming the metal silicide in the rapid thermal processing (RTP) system; and wherein the inert gas in the controlled ambient transfer module limiting oxidation of the silicon or polysilicon surface after the reducing.

2. The method of claim 1, further comprising:

prior to removing organic contaminants, removing metallic contaminants from the substrate surface in a wet clean chamber in the integrated system before reducing the silicon surface;

after removing metallic contaminants, moving the substrate from the wet clean chamber into a lab-ambient transfer module;

moving the substrate from the lab-ambient transfer module into a second loadlock;

moving the substrate from the second loadlock into the vacuum transfer module;

moving the substrate from the vacuum transfer module into the oxygen plasma reactor to perform the removing organic contaminants.

3. The method of claim 2, further comprising:

after forming the metal silicide in the RTP system, moving the substrate from the RTP system into the vacuum transfer module;

moving the substrate from the vacuum transfer module into the second loadlock;

moving the substrate from the second loadlock into the lab-ambient transfer module;

moving the substrate from the lab-ambient transfer module to exit the integrated system.

4. The method of claim 2, wherein the metallic contaminants are removed by a wet clean process using a cleaning solution that includes an acid or a base, and wherein the acid is selected from the group consisting of sulfuric acid, citric acid, acetic acid, hydrochloric acid and hydrofluoric acid, and wherein the base is selected from the group consisting of ammonium hydroxide, tetramethylammonium chloride (TMAH), and a mixture of ammonium hydroxide and hydrogen peroxide.

5. The method of claim 1, wherein a hydrogen-containing plasma of the hydrogen-containing plasma system is generated by hydrogen ($H_2$) gas, ammonia ($NH_3$) gas, or a combination of both gases.

6. The method of claim 1 wherein the silicon or polysilicon surface is doped with an n-type or p-type dopant.

7. The method of claim 1, wherein the metal is selected from the group consisting of Ni, or Co.

8. The method of claim 1, further comprising
cleaning the substrate surface after selectively depositing the layer of the metal on the silicon surface.

9. The method of claim 1, wherein the silicon surface is a source region, a drain region or a substrate resistor contact landing region on a device.

10. The method of claim 1, wherein the polysilicon surface is a gate region, resistor region, capacitor region or inductor region on a device.

11. The method of claim 1, wherein the hydrogen-containing plasma reduction is processed at a pressure below one Torr.

12. A method of preparing a substrate surface of a substrate to selectively deposit a layer of a metal on a silicon or polysilicon surface of the substrate to form a metal silicide in an integrated system configured for performing both dry and wet processes, while maintaining the substrate in the integrated system, performing the operations comprising:

removing metallic contaminants from the substrate surface in a wet clean chamber in the integrated system;

after removing metallic contaminants, moving the substrate from the wet clean chamber into a lab-ambient transfer module;

moving the substrate from the lab-ambient transfer module into a first loadlock;

moving the substrate from the first loadlock into a vacuum transfer module;

moving the substrate from the vacuum transfer module into an oxygen plasma reactor;

removing organic contaminants from the substrate surface in the oxygen plasma reactor, the oxygen plasma reactor coupled to a vacuum transfer module, the temperature of the oxygen plasma process is less than about 120° C. to prevent forming a thick silicon oxide layer on the silicon surface;

after removing organic contaminants, moving the substrate from the oxygen plasma reactor to the vacuum transfer module;

moving the substrate from the vacuum transfer module into a hydrogen-containing plasma system coupled to the vacuum transfer module;

reducing the silicon or polysilicon surface in the hydrogen-containing plasma system after removing organic contaminants to convert silicon oxide on the silicon or polysilicon surface to silicon, and wherein the silicon or polysilicon surface is reduced to increase the selectivity of the metal on the silicon surface;

upon completing the reducing in the hydrogen-containing plasma system, moving the substrate into the vacuum transfer module operated under vacuum;

moving the substrate from the vacuum transfer module into a second loadlock under vacuum, and providing the second loadlock with an inert gas, the second loadlock for transferring out of the vacuum transfer module and into a controlled ambient transfer module;

moving the substrate from the second loadlock to the controlled ambient transfer module, the controlled ambient transfer module provided with the inert gas;

transferring the substrate in the controlled ambient transfer module, having the inert gas, into an electroless deposition module that is coupled to the controlled ambient transfer module;

selectively depositing the layer of the metal on the silicon or polysilicon surface of substrate through electroless deposition in the electroless deposition module, the inert gas in the controlled ambient transfer module limiting oxidation of the silicon or polysilicon surface after the reducing;

after depositing the layer of the metal, moving the substrate from the electroless deposition module into the controlled ambient transfer module;

moving the substrate from the controlled ambient transfer module into the second loadlock;

moving the substrate from the second loadlock into the vacuum transfer module;

moving the substrate from the vacuum transfer module into a rapid thermal processing (RTP) system that is coupled to the vacuum transfer module;

forming the metal silicide in the rapid thermal processing (RTP) system; and wherein the electroless deposition module enables a dry-in/dry-out processing of the substrate, wherein the substrate goes in and comes out the electroless deposition module in a dry state.

13. The method of claim 12, wherein the metallic contaminants are removed by a wet clean process using a cleaning solution that includes an acid or a base, and wherein the acid is selected from the group consisting of sulfuric acid, citric acid, acetic acid, hydrochloric acid and hydrofluoric acid, and wherein the base is selected from the group consisting of ammonium hydroxide, tetramethylammonium chloride (TMAH), and a mixture of ammonium hydroxide and hydrogen peroxide.

14. The method of claim 12, wherein a hydrogen-containing plasma of the hydrogen-containing plasma system is generated by hydrogen ($H_2$) gas, ammonia ($NH_3$) gas, or a combination of both gases.

15. The method of claim 12, wherein the silicon or polysilicon surface is doped with an n-type or p-type dopant.

16. The method of claim 12, wherein the metal is selected from the group consisting of Ni, or Co.

17. The method of claim 12, further comprising
cleaning the substrate surface after selectively depositing the layer of the metal on the silicon surface.

18. The method of claim 12, wherein the substrate is transferred or processed in controlled environment in the integrated system after the silicon surface has been reduced by being transferred or processed in a vacuum environment or in an inert-gas-filled environment to control the exposure of the substrate surface to oxygen.

19. The method of claim 18, wherein controlling the exposure of the substrate surface to oxygen enables the thin layer of metal being selectively deposited on the silicon surface.

20. The method of claim 12, wherein the hydrogen-containing plasma reduction is processed at a pressure below one Torr.

* * * * *